(12) United States Patent
Vinciarelli et al.

(10) Patent No.: US 7,361,844 B2
(45) Date of Patent: Apr. 22, 2008

(54) POWER CONVERTER PACKAGE AND THERMAL MANAGEMENT

(75) Inventors: Patrizio Vinciarelli, Boston, MA (US); Michael B. Lafleur, East Hampstead, NH (US); Charles I. McCauley, Andover, MA (US); Paul V. Starenas, Windham, NH (US)

(73) Assignee: VLT, Inc., Sunnyvale, CA (US)

( * ) Notice: Subject to any disclaimer, the term of this patent is extended or adjusted under 35 U.S.C. 154(b) by 642 days.

(21) Appl. No.: 10/303,613

(22) Filed: Nov. 25, 2002

(65) Prior Publication Data

US 2004/0100778 A1    May 27, 2004

(51) Int. Cl.
*H05K 3/36*     (2006.01)
*H05K 1/00*     (2006.01)
*H05K 1/16*     (2006.01)

(52) U.S. Cl. .................. 174/260; 361/761; 29/830; 174/252

(58) Field of Classification Search ............ 174/260, 174/252; 361/761, 762, 764, 763; 29/830
See application file for complete search history.

(56) References Cited

U.S. PATENT DOCUMENTS

| | | | |
|---|---|---|---|
| 2,917,678 | A | 12/1959 | Tepper |
| 3,192,307 | A | 6/1965 | Lazar |
| 3,205,408 | A | 9/1965 | Boehm et al. |
| 4,417,296 | A | 11/1983 | Schelhorn |
| 4,479,686 | A | 10/1984 | Hoshino et al. |
| 4,531,145 | A | 7/1985 | Wiech, Jr. |
| 4,551,746 | A | 11/1985 | Gilbert et al. |
| 4,551,747 | A | 11/1985 | Gilbert et al. |
| 4,622,621 | A | 11/1986 | Barre |
| 4,741,472 | A | 5/1988 | Bärmann |
| 4,750,089 | A | 6/1988 | Derryberry et al. |

(Continued)

FOREIGN PATENT DOCUMENTS

EP    0 674 474    9/1995

(Continued)

OTHER PUBLICATIONS

Gates and Yokoro, "Sealed Chip-on-board Circuit Protection", 3rd International SAMPE Electronics Conference, pp. 929-938, Jun. 1989.

(Continued)

*Primary Examiner*—Jeremy C Norris
(74) *Attorney, Agent, or Firm*—Fish & Richardson P.C.

(57) ABSTRACT

Power conversion apparatus includes a circuit board with power conversion circuitry and a package having an upper portion and a lower portion that respectively enclose circuitry on a top surface and a bottom surface of the circuit board. The lower portion encloses a smaller region than that enclosed by the upper portion. The regions are arranged to define an overhang region on the bottom surface of the circuit board. Interface contacts are provided on the bottom surface in the overhang region for making electrical connections to the circuit board. A thermal extender includes a surface for mounting a heat dissipating power converter and a surface for mating with an external circuit board. Interface conductors mate with contacts on the power converter and with conductive regions on the external circuit board. A heat sink is thermally coupled to remove heat generated by the power converter.

75 Claims, 21 Drawing Sheets

U.S. PATENT DOCUMENTS

| | | | |
|---|---|---|---|
| 4,879,630 A | 11/1989 | Boucard et al. | |
| 4,918,811 A | 4/1990 | Eichelberger et al. | |
| 4,953,005 A | 8/1990 | Carlson et al. | |
| 4,959,750 A | 9/1990 | Cnyrim et al. | |
| 5,019,941 A | 5/1991 | Craft | |
| 5,075,821 A | 12/1991 | McDonnal et al. | |
| 5,200,884 A | 4/1993 | Ohashi | |
| 5,249,971 A | 10/1993 | Lai et al. | |
| 5,352,851 A | 10/1994 | Wallace et al. | |
| 5,365,403 A | 11/1994 | Vinciarelli et al. | |
| 5,394,300 A | 2/1995 | Yoshimura | |
| 5,526,234 A * | 6/1996 | Vinciarelli et al. | 361/740 |
| 5,615,089 A * | 3/1997 | Yoneda et al. | 361/764 |
| 5,728,600 A | 3/1998 | Saxelby, Jr. et al. | |
| 5,920,458 A * | 7/1999 | Azar | 361/704 |
| 5,940,576 A * | 8/1999 | de Simon | 388/811 |
| 6,000,125 A | 12/1999 | Kang | |
| 6,005,773 A | 12/1999 | Rozman et al. | |
| 6,025,768 A | 2/2000 | Martich | |
| 6,031,726 A | 2/2000 | Vinciarelli et al. | |
| 6,052,045 A | 4/2000 | Martich | |
| 6,075,381 A * | 6/2000 | LaBerge | 326/41 |
| 6,137,062 A * | 10/2000 | Zimmerman | 174/260 |
| 6,208,531 B1 | 3/2001 | Vinciarelli et al. | |
| 6,215,682 B1 * | 4/2001 | Akamatsu | 363/141 |
| 6,275,052 B1 * | 8/2001 | Hembree et al. | 324/754 |
| 6,294,971 B1 | 9/2001 | Schenk et al. | |
| 6,310,301 B1 | 10/2001 | Heinrich et al. | |
| 6,316,737 B1 | 11/2001 | Evans et al. | |
| 6,359,784 B1 | 3/2002 | Stevens | |
| 6,403,009 B1 | 6/2002 | Saxelby, Jr. et al. | |
| 6,434,005 B1 | 8/2002 | Vinciarelli et al. | |
| 6,559,665 B1 * | 5/2003 | Barabi | 324/755 |
| 6,728,106 B2 * | 4/2004 | Kim | 361/719 |

FOREIGN PATENT DOCUMENTS

| | | |
|---|---|---|
| GB | 2 214 731 | 6/1989 |
| JP | 50-48579 | 5/1975 |
| JP | 63-146940 | 9/1988 |
| JP | 1-73966 | 5/1989 |
| JP | 2-142173 | 5/1990 |
| JP | 2-129766 | 10/1990 |
| JP | 5-315192 | 11/1993 |

OTHER PUBLICATIONS

Vinciarelli, "Factorized Power Architecture With Point of Load Sine Amplitude Converters," U.S. Appl. No. 10/066,418, filed Jan. 31, 2002.

Vinciarelli, "Factorized Power Architecture with Point of Load Sine Amplitude Converters," CIP U.S. Appl. No. 10/264,327, filed Oct. 1, 2002.

Data sheet, "Preliminary Tech Spec, Narrow Input, Isolated DC/DC Bus Converter," SynQor Document No. 005-2BQ512J, Rev. 7, pp. 1-8, Jan. 14, 2003.

Vinciarelli et al., Mounting Electronic Components on Circuit Boards, U.S. Appl. No. 09/340,707, filed Jun. 29, 1999.

Data sheet, "Full Function Synchronous Buck Power Block", Model iP1001, published by International Rectifier, El Segundo, CA, USA, pp. 1-18, Jul. 26, 2002.

Intel, "Ball Grid Array (BGA) Packaging," 14.1, 2000 Packaging Databook, pp. 14-1-14-30.

Intel, "The Chip Scale Package (CSP)," 15.1, 2000 Packaging Databook, pp. 15-1-15-16.

Coto Technology B40 4-Channel RF Relays, printed from Coto Technology website at http://www.cotorelya.com/html/reed_relay_b40_rf_seris.htm.

Coto Technology Product Selector Chart, printed from Coto Technology website at http://www.cotorelay.com/htm/reed_relay_dry_reed_switch_p.htm.

* cited by examiner

POWER CONVERTER PACKAGE AND THERMAL MANAGEMENT

TECHNICAL FIELD

This invention relates to power converters, and more particularly to packaging of and thermal management in power converters.

BACKGROUND

Electronic power converters accept electric power from an input source and convert it into a form suitable for use by a load. As defined herein, power converters are devices that convert electric power from an AC source or a DC source to deliver it to a load at an AC voltage or a DC voltage while providing some of the following functions: voltage step-up, voltage step-down voltage regulation, with or without galvanic isolation. Examples of power converters include DC-DC converters, switching regulators and active filters.

The power density of a power converter as defined herein is the full rated output power of the power converter divided by the volume occupied by the converter. Trends in contemporary power conversion have resulted in dramatic increases in power density of marketable power converters. Prior to 1984, power densities were typically below 10 Watts-per-cubic-inch. In contrast, power densities greater than 500 Watts-per-cubic-inch have become possible today. A very high density, galvanically isolated, point of load DC-to-DC transformer, called a "VTM" is described by Vinciarelli in U.S. patent application Ser. No. 10/066,418, filed on Jan. 31, 2002, entitled "Factorized Power Architecture With Point of Load Sine Amplitude Converters," and in the CIP application Ser. No. 10/264,327, filed Oct. 1, 2002 (the "Factorized Application").

The current density of a power converter is defined herein as its full rated output current divided by the board area occupied by the converter. Escalating current requirements of microprocessors (CPU's), now approaching 100 Amperes, and the need to provide such currents within a small footprint in close proximity to the CPU has gone beyond the capacity of contemporary power supply technology. Commercially available solutions are characterized by a current density of less than 10 A/in2 and are inadequate to support future CPU requirements. Sine Amplitude Converters, of the kind described in the Factorized Application ibid, are capable of providing the low voltage requirements of future microprocessors with current densities exceeding 50 A/in2. They utilize a two-sided circuit board assembly including transformer core structures protruding from both sides of the circuit board. Output currents in excess of 50 Amperes need to be carried from the converter's PC board, at one elevation, to the CPU board, at a different elevation. These interconnections need to be made with low resistance and inductance, consistent with the current slew rate requirements of a highly dynamic load.

Power converters dissipate heat in operation. Increases in power density make thermal management more difficult, particularly where the increase in power density exceeds the corresponding increase in efficiency causing a net increase in heat density. Thus, advancements in power conversion technology may often present significant challenges in terms of thermal management technology. These challenges impose constraints on the packaging architecture used to house the converter and its input and output terminals: the package must exhibit low thermal resistance between its internal hot spots, particularly its semiconductor junctions, and external heat sinks. Depending on the specific thermal environment surrounding the power converter, it is desirable to remove heat from the converter package through its case and/or terminals. Low junction-to-case and junction-to-terminal thermal resistances are required to keep internal temperature rises acceptable. And the need for a good thermal interface must not interfere with the need for flexible mounting of the power converter package, while respecting constraints associated with mechanical tolerances of the converter package and of the system with which the converter is coupled.

One way to mount a high-density power converter, shown in FIG. 1, is described in Vinciarelli et al, U.S. Pat. No. 5,526,234, "Packaging Electrical Components" (assigned to the same assignee as this application and incorporated by reference). In the Figure, steps on the case of a power converter 10 allow the upper wall of the converter 12 to lie within a hole 14 in circuit board 16. The effective height of the combined power converter package and circuit board is reduced because a portion of the height of the package is coextensive with the thickness of the circuit board 16. Thermal management is enhanced because both the upper and lower surfaces 12, 13 of the power converter are exposed for heat removal (e.g., by use of forced air or by heat sink attachment). The power density of power converter 10, on a stand-alone basis, is the full rated output power of the converter divided by the total volume occupied by the converter. However, the equivalent power density of the converter, when mounted as shown in FIG. 1, is higher than the stand-alone power density because a portion of the height of the power converter package is coextensive with the thickness of the circuit board 16 and the incremental volume occupied by the converter above and below the circuit board 16 is less than the total volume of the stand-alone converter.

SynQor, Inc., Hudson, Mass., USA manufactures DC-DC power converters and DC transformers which comprise components mounted on both sides of a printed circuit board and magnetic components which pass through apertures in the printed circuit board and pins for connection to another circuit board. One such converter, called a "BusQor™ Bus Converter," is described in data sheet "Preliminary Tech Spec, Narrow Input, Isolated DC/DC Bus Converter," SynQor Document No. 005-2BQ512J, Rev. 7, August 2002.

Vinciarelli et al, U.S. Pat. No. 6,031,726, "Low Profile Mounting of Power Converters with the Converter Body in an Aperture" (assigned to the same assignee as this application and incorporated by reference) describes power conversion apparatus in which a power converter 20 extends through an aperture 21 in a circuit board 23. One such embodiment is shown in FIGS. 2A through 2C. In the figures, the power converter 20 is mechanically and electrically connected to a terminal board 22 and power and signal inputs and outputs are routed, via conductive runs and solder connections, from contact pads 26 on the terminal board to contact pads 24 which extend from the power converter body. A heat sink 27 surrounds the outside of the power converter to aid in heat removal. The length, L2, of the terminal board 22, is greater than the length, L1, of the aperture 21 in the circuit board 23. The contact pads 26 are connected by solder (not shown) to runs 25 on the circuit board 23. Because a portion of the body of the power converter 20 is coextensive with the circuit board 23, the equivalent power density of the power converter is greater than the stand-alone power density, as explained above with respect to FIG. 1.

A power conversion apparatus, in which a power converter is mounted in an aperture in a circuit board, and in which a compliant connection scheme along the sides of the power converter allows for variation of the extension of the power converter within the aperture, is described in Vinciarelli et al, U.S. patent application Ser. No. 09/340,707, filed on Jun. 29, 1999, and entitled "Mounting Electronic Components on Circuit Boards." A power conversion apparatus, in which a power converter is mounted in an aperture in a circuit board, and in which at least four sides of the power converter, including the two sides which lie entirely above and below the surfaces of the circuit board, are covered with heat sinks to aid in the removal of heat from the power converter, is described in Vinciarelli et al, U.S. Pat. No. 6,434,005, "Power Converter Packaging" (assigned to the same assignee as this application and incorporated by reference).

Takatani, Japan Patent 2-142173, "Integrated Circuit Part and Mounting Structure Thereof" describes an assembly 450, shown in FIG. 18, consisting of a pair of over molded integrated passive networks 452, 453 connected by leads 454 to circuit etches (not shown) on both sides of a substrate 456. As shown in the Figure, the assembly may be mounted over an aperture 458 in a printed circuit board 460 so that the over molded integrated passive network 453 on one side of the substrate pass into the aperture and contact pads 460 arranged on the surface of the periphery of the substrate 456 are soldered to mating contacts 462 on printed circuit board along the periphery of the aperture 458.

Techniques for over molding electronic components on one side of a substrate are known. In one example, electronic devices mounted on one side of a printed circuit board assembly are over-molded with encapsulant and the other side of the printed circuit board assembly, which is not over-molded, comprises a ball grid or a land grid array of electrical contacts. FIG. 13 illustrates a ball grid array package of the kind shown in a datasheet for a "Full Function Synchronous Buck Power Block", model iP1001, published by International Rectifier, El Segundo, Calif., USA. In the figure, power conversion circuitry (not shown) consists of components mounted on top of a circuit board. The components and the board are over-molded with encapsulant to form a packaged device 232. A ball grid array of contacts (e.g., contacts 233 in FIG. 13) is arranged along the bottom surface of the device. In application, the ball grid array of contacts is soldered to mating contact pads or runs (e.g., contact pads 235) on the surface of a printed circuit board ("PCB") 239. The package architecture exemplified above, sometimes referred to as "System In a Package" (SIP), provides some of the electrical, mechanical and thermal management characteristics required of high power density and high current density converters. However, the SIP architecture is incompatible with two-sided circuit board assembly including transformer core structures protruding from both sides of the circuit board, as described in the Factorized Application ibid. Furthermore, the SIP package provides limited mechanical and thermal management flexibility.

Intel Corporation, Santa Clara, Calif., USA, manufactures microprocessors which are packaged in a package, called a Micro-FCPGA package, which comprises a component over molded on one side of a substrate and a pin-grid-array and exposed capacitors on the other side of a substrate.

Saxelby, Jr., et al, U.S. Pat. No. 5,728,600, "Circuit Encapsulation Process" and Saxelby, Jr., et al, U.S. Pat. No. 6,403,009, "Circuit Encapsulation" (both assigned to the same assignee as this application and both incorporated in their entirety by reference) describe ways of over-molding both sides of a printed circuit board assembly while leaving opposing regions on both sides of the printed circuit board free of encapsulant. This is useful for exposing a row of contacts that extend along an edge of the printed circuit board on both sides of the board.

SUMMARY

In general, in one aspect an apparatus includes a power converter with a circuit board having a top surface and a bottom surface, power conversion circuitry, and a package. The power conversion circuitry includes a magnetic circuit having a magnetically permeable core, upper circuitry in a first region on the top surface of the circuit board, and lower circuitry in a second region on the bottom surface of the circuit board. The package includes an upper portion defining an external top surface and a lower portion defining an external bottom surface. The upper portion encloses the first region including the upper circuitry and connections between the upper circuitry and the circuit board. The lower portion encloses the second region including the lower circuitry and connections between the lower circuitry and the circuit board. The second region is smaller than the first region, the first and second regions are arranged to define an overhang region on the bottom surface of the circuit board, and the overhang region extends along two or more sides of a periphery of the bottom surface. Interface contacts are arranged within the overhang region on the bottom surface of the circuit board for making electrical connections to the power converter.

In general, in another aspect [2] an apparatus includes a circuit board having a top surface and a bottom surface, circuitry, and a package. The circuitry includes upper circuitry in a first region on the top surface of the circuit board, and lower circuitry in a second region on the bottom surface of the circuit board. The package includes an upper portion defining an external top surface and a lower portion defining an external bottom surface. The upper portion encloses the first region including the upper circuitry and connections between the upper circuitry and the circuit board. The lower portion encloses the second region including the lower circuitry and connections between the lower circuitry and the circuit board. The second region is smaller than the first region, the first and second regions are arranged to define an overhang region on the bottom surface of the circuit board, and the overhang region extends along two or more sides of a periphery of the bottom surface. Interface contacts are arranged within the overhang region on the bottom surface of the circuit board for making electrical connections to the circuitry.

Implementations of the apparatuses may include one or more of the following features. The upper portion [3] or lower portion [4] may include an encapsulating material. [5] The overhang may extend along the entire periphery of the bottom surface of the circuit board. [6] The lower portion may have a first thickness defined by the maximum distance between the external bottom surface and the bottom surface of the circuit board; the upper portion may have a second thickness defined by the maximum distance between the external top surface and the top surface of the circuit board; and the first thickness may be greater than the second thickness. [7] The interface contacts may be adapted to make connection with the power converter at an elevation between the external bottom surface and the bottom surface of the circuit board. [8] The magnetic core may extend through the circuit board. [9] The upper and lower portions may enclose all of the power conversion circuitry. [10] The interface contacts may include conductive elements. The conductive elements may include [11] a ball-grid array, [12] a land grid array, or [13] pins. [14] The power conversion circuitry may include heat dissipating power conversion components arranged on the top surface of the circuit board and an average thermal resistance between the top surface of the circuit board and the external top surface may be less than 3 C/Watt per square inch of the top surface of the circuit board. [15] The heat dissipating power conversion components may include a MOSFET. [16] The power converter may be mounted to an external circuit board having a top surface and a bottom surface separated by a board thickness and conductive regions on the top surface for making connections to the power converter. [17] The external circuit board may have a board aperture, the lower portion may extend into the board aperture, and the interface contacts may be connected to the conductive regions. [18] The lower portion may have a first thickness defined by the maximum distance between the external bottom surface and the bottom surface of the circuit board and the upper portion may have a second thickness defined by the maximum distance between the external top surface and the top surface of the circuit board. The first thickness may be greater than the second thickness and a portion of the lower portion may extend below the first surface. [19] An interconnect extender may have interface conductors for connecting the interface contacts to the conductive regions and a first surface area for mating with the overhang region and a second surface area for mating with the external circuit board. The power converter may be mounted to the first surface area and the second surface area may be mounted to the external circuit board. [20] The interconnect extender may have an extender aperture and the lower portion may extend into the extender aperture. [21] The interconnect extender may have an outer periphery generally matching the outer periphery of the overhang. [22] The extender aperture may generally match the outer periphery of the lower portion. [23] The lower portion may have a first thickness defined by the maximum distance between the external bottom surface and the bottom surface of the circuit board and the interconnect extender may have a thickness between the first surface area and the second surface area greater than the first thickness. [24] The external circuit board may include a board aperture. The lower portion may have a first thickness defined by the maximum distance between the external bottom surface and the bottom surface, the interconnect extender may have a thickness between the first surface area and the second surface area less than the first thickness, and the lower portion may extend into the board aperture. [25] A connector may have conductive sockets connected to the conductive regions. [26] A first end of the interface conductors may connect to the interface contacts and a second end of the interface conductors may have pins to connect with the sockets. [27] The interface contacts may include conductive elements. [28] The conductive elements may include [28] a ball-grid array, [29] a land grid array, or [30] pins. [31] A first end of the interface conductors may be adapted to connect to the interface contacts and a second end of the interface conductors may be adapted to connect to the conductive regions. The conductive elements [32] may include a ball-grid array, [33] a land grid array, [34] pins, or [35] J-leads. [36] The circuit board may be a multilayer circuit board including alternating layers of electrically conductive and insulating materials and the interface contacts may be connected to the multilayer circuit board. [37] The interface contacts may be BGA contacts. [38] The top and bottom surfaces of the multilayer board may be generally rectangular with the BGA contacts arranged along the long sides. [39] The dimensions of the rectangular surfaces may be approximately 21 mm×32 mm and the BGA contacts may be on a 1 mm pattern. [40] A thermal resistance between the top surface of the multilayer board and the conductive regions on the second surface of the external circuit board may be less than 40 C/Watt per cm of package perimeter. [41] A card-edge connector may be mounted to the external circuit board, the second surface area may have contact fingers for mating with the card-edge connector, and the extender may be mounted to the external circuit board using the connector. [42] The first surface area may be generally perpendicular to the second surface area and the aperture may generally match the outer periphery of the lower portion. [78] An external circuit board may have a first surface and a second surface separated by a board thickness and conductive regions on the second surface for making connections to the circuitry. An interconnect extender may have interface conductors for connecting the interface contacts to the conductive regions, a first surface area for mating with the overhang region, and a second surface area for mating with the external circuit board. The interconnect extender may include a heat sink. The circuit board may be mounted to the first surface area and the second surface area may be mounted to the external circuit board. [79] The heat sink may be attached to the first surface area. [80] The interconnect extender may include a thermally conductive layer and the heat sink may include an extension of the thermally conductive layer. [81] An external circuit board may include a first surface and a second surface separated by a board thickness, and have conductive regions on the second surface for making connections to the circuit board. A heat sink may be located on the external circuit board and thermally coupled to the external circuit board. The circuit board may be mounted to the external circuit board and the circuitry may be thermally coupled to the heat sink through the circuit board and the external circuit board. [82] The heat sink may be mounted to the second surface of the external circuit board. [83] The package may have a perimeter and the thermal resistance between the heat sink and the top surface of the circuit board may be less than 80 C/Watt per cm of the package perimeter.

In general in another aspect [43] a method includes packaging a power converter. A circuit board having a top surface and a bottom surface is provided and power conversion circuitry is arranged on the top and bottom surfaces of the circuit board with upper circuitry in a first region on the top surface of the circuit board, and lower circuitry in a second region on the bottom surface of the circuit board. The first region, the upper circuitry, and connections between the upper circuitry and the circuit board are enclosed in an upper portion enclosure. The second region, the lower circuitry, and connections between the lower circuitry and the circuit board are enclosed in a lower portion enclosure. The second region is smaller than the first region. The first and second regions are arranged to define an overhang region on the bottom surface of the circuit board with the overhang region extending along two or more sides of a periphery of the bottom surface of the circuit board. Interface contacts are provided on the bottom surface in the overhang region for making electrical connections to the power converter.

Implementations of the general method may include one or more of the following features. The first [44] or [45] second region may be enclosed by encapsulation. [46] All of the power conversion circuitry on the top surface of the circuit board may be enclosed in the first region. [47] The enclosing of the first and second regions may enclose all of the power conversion circuitry. [48] The enclosing of the first and second regions may include encapsulation. [49] Interface contacts may be attached to the printed circuit board before encapsulating the second region. [50] The attaching may include attaching a BGA to the printed circuit board. [51] The encapsulating may include using a mold having a step over cavity for accommodating the interface contacts. [52] An external circuit board having a top surface and a bottom surface separated by a board thickness and conductive regions on the top surface for making connections to the power converter may be provided. The power converter may be mounted to the external circuit board. [53] An aperture in the external circuit board may be provided for accommodating the lower portion enclosure. The lower portion enclosure may be placed in the aperture and the interface contacts may be connected to the conductive regions during the mounting. [54] The lower portion enclosure may have a first thickness defined by the maximum distance between an external bottom surface and the bottom surface of the circuit board and the upper portion may have a second thickness defined by the maximum distance between an external top surface and the top surface of the circuit board. The first thickness may be made greater than the second thickness and the power converter may be mounted with a portion of the lower portion enclosure extending below the bottom surface of the external circuit board. [55] An interconnect extender having interface conductors for connecting the interface contacts to the conductive regions may be provided for mating with the overhang region and the top surface of the external circuit board. [56] An extender aperture may be provided in the interconnect extender for accommodating the lower portion enclosure. [57] An outer periphery of the interconnect extender may be generally matched to the outer periphery of the overhang. [58] The extender aperture may be matched with the outer periphery of the lower portion enclosure. [59] The lower portion enclosure may have a first thickness defined by the maximum distance between an external bottom surface and the bottom surface, and the interconnect extender may be provided with a thickness greater than the first thickness. [60] The lower portion enclosure may have a first thickness defined by the maximum distance between an external bottom surface and the bottom surface of the circuit board and the interconnect extender may be provided with a thickness less than the first thickness. A board aperture may be provided in the external circuit board and the lower portion enclosure may be placed into the extender aperture and in the board aperture. [61] The interface contacts may be connected to the conductive regions using a ball grid array. [62] A thermal resistance between the top surface of the circuit board and the conductive regions on the top surface of the external circuit board may be less than 40 C/Watt per cm of package perimeter. [63] The power converter may be mounted to the interconnect extender and the interconnect extender may be mounted to the external circuit board with the overhang surface generally perpendicular to the top or bottom surface of the external circuit board. [64] The interconnect extender may be mechanically stabilized to the board. [65] The power converter may be mounted to the interconnect extender. A card edge connector may be provided on the external circuit board for receiving the interconnect extender with the overhang surface generally perpendicular to the top or bottom surface of the external circuit board.

In general in another aspect [66] a method for encapsulating two sides of a substrate includes providing a mold including a first mold section having a first cavity for encapsulating a first region of a first surface of the substrate and a second mold section having a second cavity for encapsulating a second region of a second surface of the substrate. A fill conduit for introducing encapsulating material into the first cavity is provided at a first end of the mold. A channel having an opening in the first cavity at an end opposite the first end for allowing encapsulating material to flow from the first cavity into the second cavity is also provided.

In general in another aspect [67] a method for encapsulating two sides of a substrate includes closing a mold on the substrate. A first mold section has a first cavity for encapsulating a first region of a first surface of the substrate and a second mold section has a second cavity for encapsulating a second region of a second surface of the substrate. A sealing force for forcing the substrate against the second mold section to seal the second cavity is created by injecting encapsulating material into the first cavity.

Implementations of the general methods may include one or more of the following features. [68] A step-over cavity may be provided in the second mold section outside of the second cavity for accommodating features protruding from the second surface of the substrate. [69] The mold may be closed on the substrate, encapsulating material may be forced under pressure through the fill conduit, and the second cavity may be filled with encapsulating material conducted through the channel from the first cavity. [70] The second region may be smaller than the first region. [71] The channel may include an aperture through the substrate. [72] Encapsulating material may be conducted through a channel from the first cavity to fill the second cavity. [73] The encapsulating material may be injected into a first end of the first cavity and conducted from the first cavity from a second end opposite from the first end.

In general, in another aspect [74] an apparatus includes a power converter having a circuit board with a top surface and a bottom surface, and power conversion circuitry. The power conversion circuitry includes a magnetic circuit having a magnetically permeable core, upper circuitry in a first region on the top surface of the circuit board, and lower circuitry in a second region on the bottom surface of the circuit board. The second region is smaller than the first region and the first and second regions are arranged to define an overhang region on and extending along two or more sides of a periphery of the bottom surface of the circuit board. Interface contacts are arranged within the overhang region on the bottom surface of the circuit board for making electrical connections to the power converter. The power converter is connected to an external circuit board having an aperture larger than the second region of the power converter and conductive regions for making connections to the power converter with the second region of the power converter extending into the aperture.

Implementations of the general apparatus may include one or more of the following features. The interface contacts may include [75] a BGA, [76] an LGA, or [77] an interconnect extender.

In general, in another aspect [84] an apparatus includes a thermal extender having a first surface and second surface separated by a thickness. A first surface area on the first surface is adapted to mate with a heat dissipating power converter and a second surface area on the second surface is adapted to mount on an external circuit board. A plurality of interface conductors have a first end on the first surface for mating with contacts on the heat dissipating power converter and a second end for mating with conductive regions on the external circuit board. A heat sink is thermally coupled to the first surface area for dissipating heat generated by the power component.

Implementations of the general apparatus may include one or more of the following features. [85] The heat sink may be surface mounted to the first surface. [86] A thermally conductive layer may extend from the first surface area to the heat sink and the heat sink may include an extension of the thermally conductive layer. [87] The thermal extender may comprise a thermally conductive molding and the heat sink may comprise heat sink elements. [88] The thermal extender may include an aperture for accepting a lower portion of the heat dissipating power converter and the first surface area may be adapted for surface mounting of the converter to the extender.

In general in another aspect [89] a method to cool a power converter includes thermally coupling the power converter to an external circuit board and thermally coupling the external circuit board to a heat sink with a thermal resistance between the power converter and the heat sink of less than 80 C/Watt per cm of the power converter perimeter.

Implementations of the general methods may include one or more of the following features. [90] The thermal resistance may be less than 40 C/Watt per cm of the power converter perimeter.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 3A:
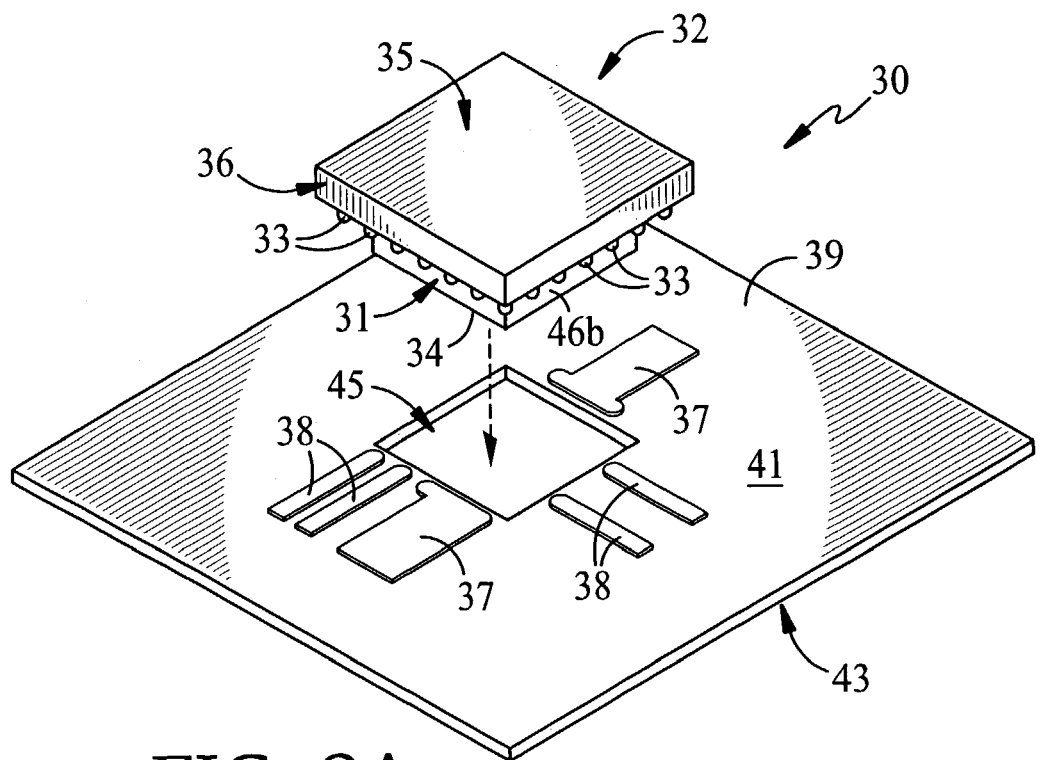
FIGS. 3A and 3B show, respectively, an exploded perspective view and a cutaway perspective view of a power converter apparatus according to the invention.
Figure 3B:
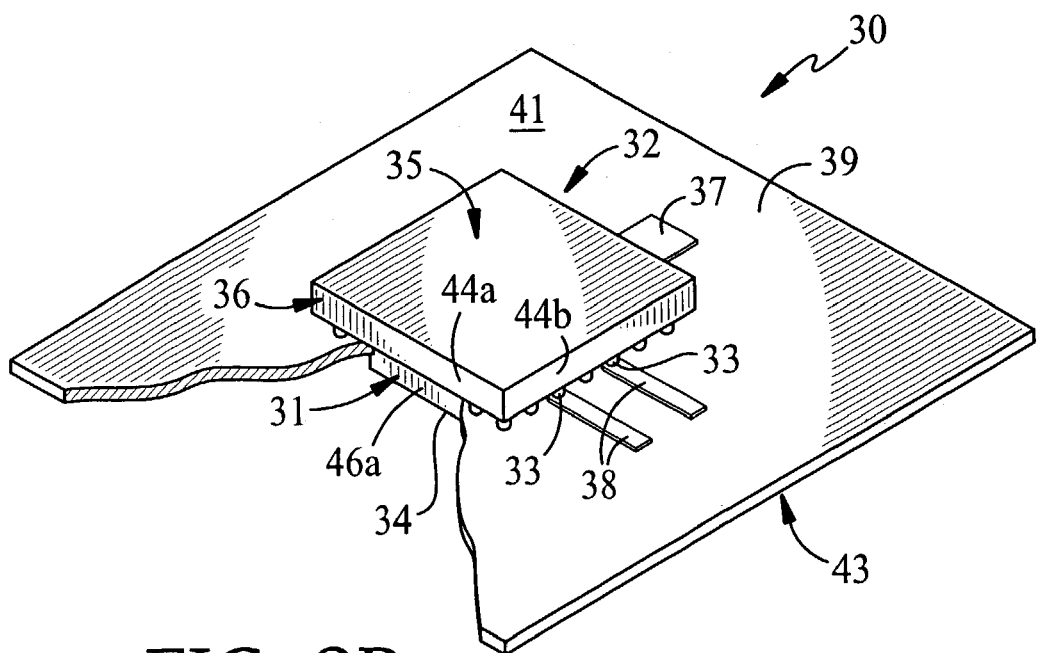
Figure 4A:
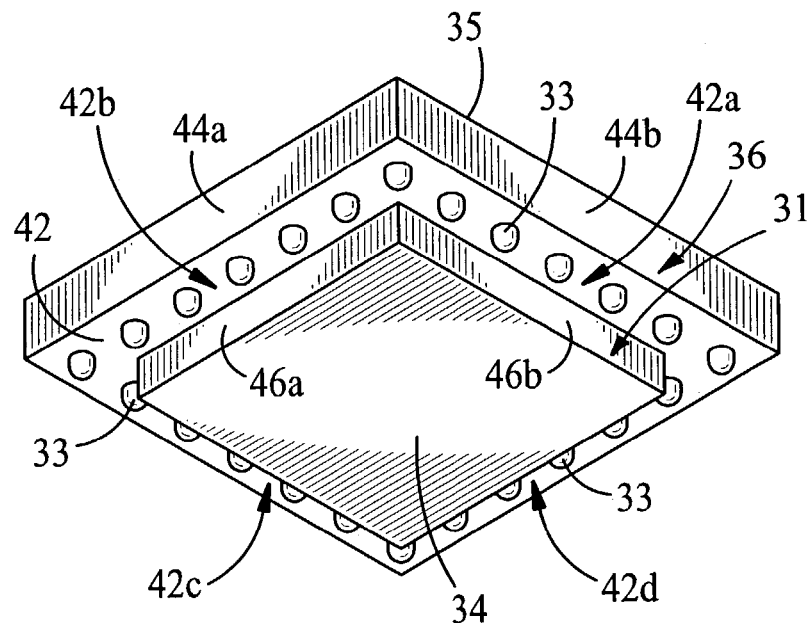
FIGS. 4A and 4B show perspective views of power converters according to the invention.
Figure 4B:
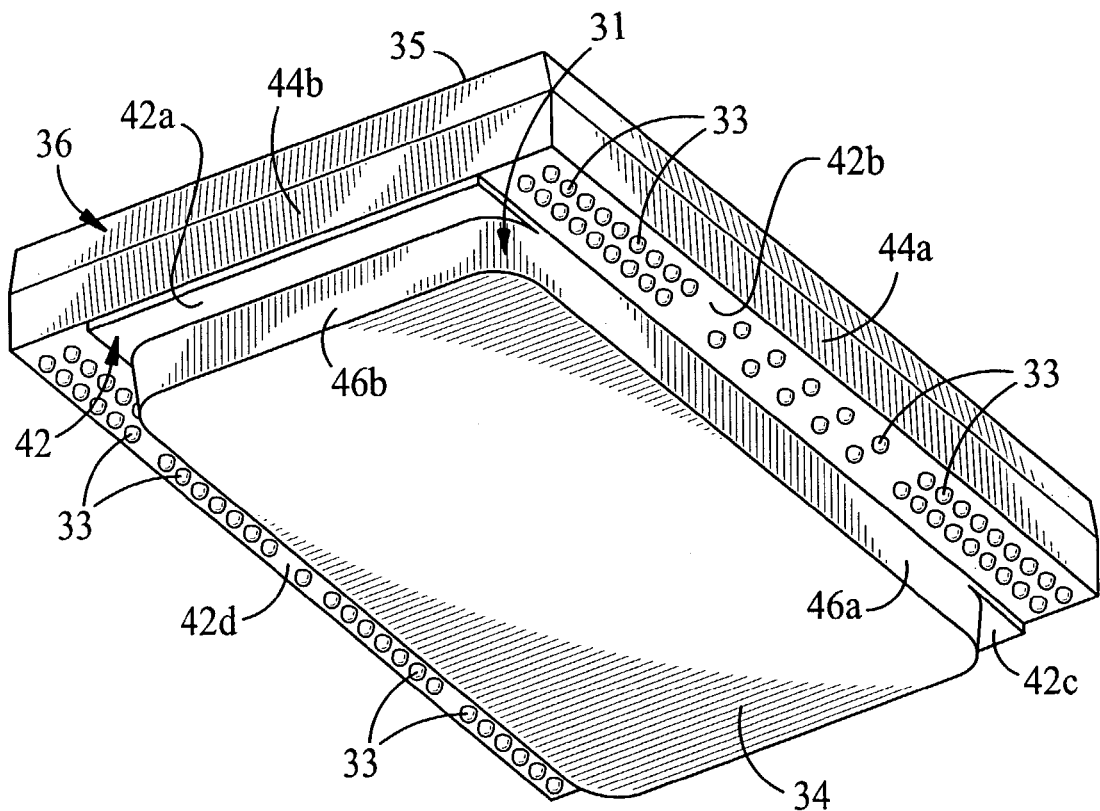

FIGS. 3A and 3B show, respectively, an exploded perspective view and a cutaway perspective view of a power converter apparatus 30. The apparatus comprises a power converter 32 and a circuit board assembly 39. A perspective view of the power converter 32, viewed from below, is shown in FIGS. 4A and 4B. Referring to FIGS. 3 and 4, the power converter comprises an upper portion 36 and a lower portion 31 which are generally of the form of a rectangular parallelepiped. The upper portion has a generally rectangular upper surface 35 and an overhang surface 42. The lower portion has a generally rectangular bottom surface 34. The sides of the lower portion 31 (e.g., sides 46a, 46b) are shorter in length than the sides of the upper portion 36 (e.g., sides 44a, 44b) allowing the upper portion 36 to overhang the lower portion 31 and exposing the overhang surface 42. The lower portion may be centered on the upper portion as shown in FIGS. 4A and 4B establishing symmetrical regions of overhang (e.g., overhang regions 42a, 42b, 42c, 42d) on overhang surface 42. Power and signal input-output contact connections to the power converter may be made via interface contacts 33 (e.g., solderable contacts, such as a ball-grid-array ("BGA") or a land grid array ("LGA")) formed on the overhang surface 42, along regions 42a-d. The interface contacts 33 may be arranged along the entire periphery (e.g. regions 42a-d as shown in FIG. 4A) or a portion of the periphery (e.g. the 2 long regions 42b, 42d as shown in FIG. 4B).

The power converter 32 may be mounted to the circuit board 39 in a "through the board" configuration as shown in FIGS. 3A and 3B. An aperture 45 is provided in the circuit board 39 to allow the lower portion 34 to protrude into the aperture. Preferably, the aperture 45 matches the periphery of the lower portion 34 in size and shape. Conductive runs (e.g. runs 37, 38) are provided on the circuit board 39 for mating with the interface contacts 33. The apparatus 30 is assembled by placing the lower portion 34 of the power converter 32 into the aperture 45 in the circuit board 39 and soldering the interface contacts 33 to the conductive runs (e.g. runs 37, 38).

Figure 5A:
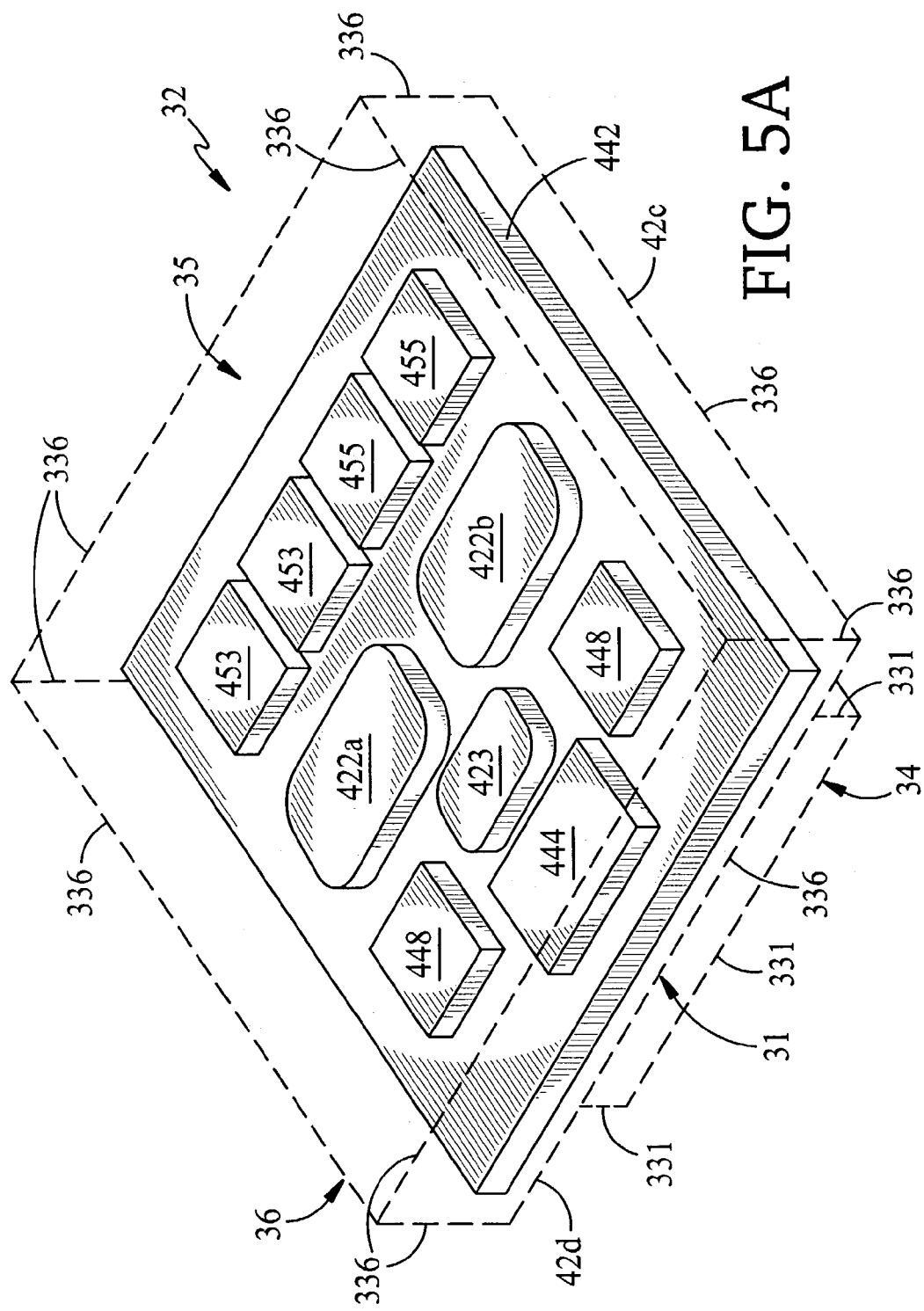
FIGS. 5A and 5B show top and bottom phantom perspective views of a power converter of t h e kind shown in FIG. 4B.
Figure 5B:
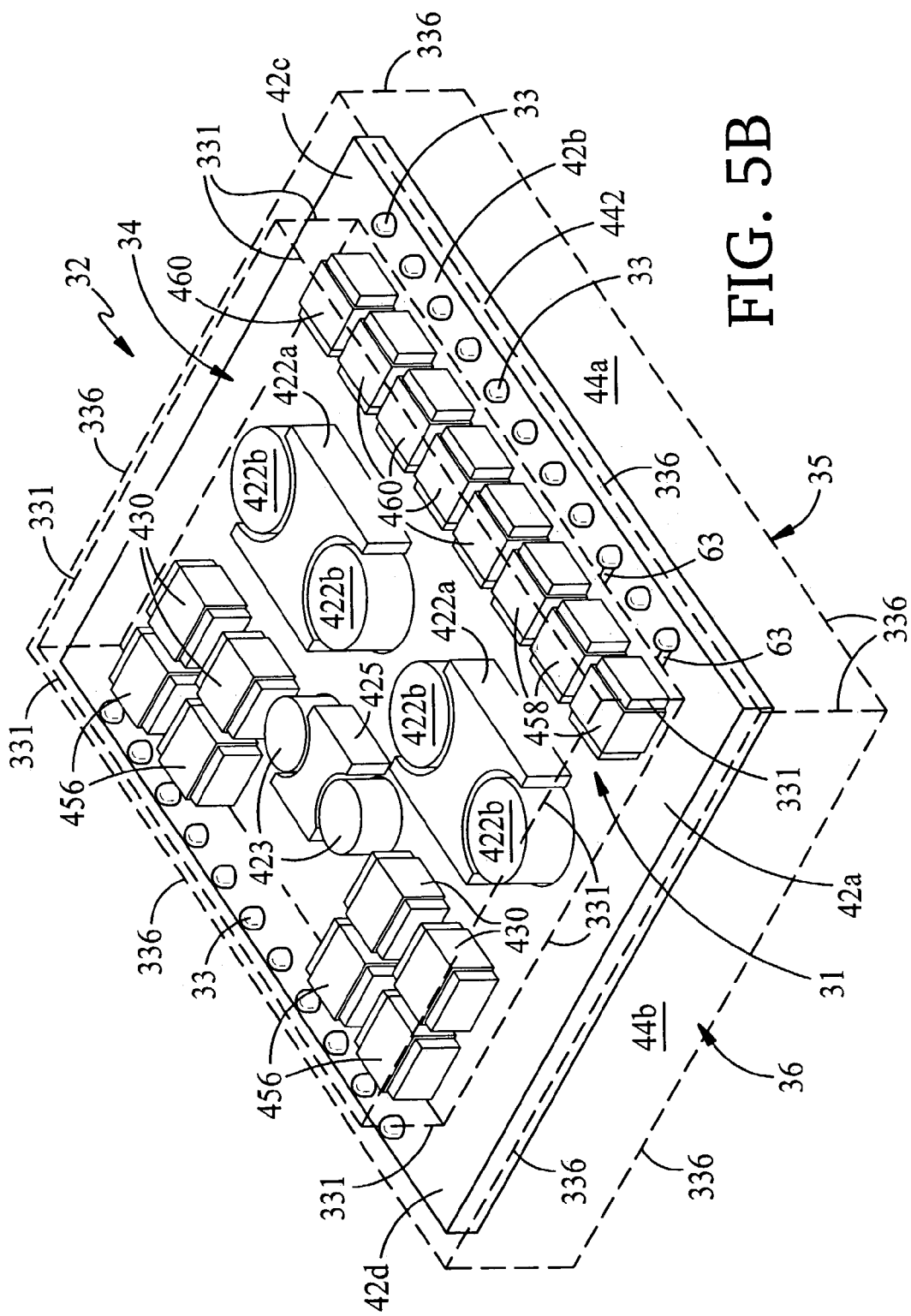

Internal details of an embodiment of the converter 32 of FIG. 4B are shown in phantom view in FIGS. 5A and 5B. The converter may be a sine amplitude converter of the kind described in connection with FIGS. 40A and 40B in the Factorized Application ibid. Reference numerals used in FIGS. 5A and 5B herein, generally correspond to the reference numerals used in FIGS. 40A and 40B of the Factorized Application. FIGS. 5A and 5B show top and bottom views of the circuit board 442. As illustrated in FIGS. 5A and 5B, components are mounted to both surfaces of the circuit board 442. Power dissipating components such as MOSFET power switches 448, synchronous rectifiers 453, 455 and/or other components ("upper electrical components") may be arranged on the top surface of the circuit board 442. Input capacitors 456, resonant capacitors 430, output filter capacitors 458, 460 and/or other components ("lower electrical components") may be arranged on the bottom surface of the circuit board 442. Magnetic components, such as isolation transformer core sets 422a, 422b, may extend over the top and bottom surface of the circuit board. In applications where heat is primarily removed by forced airflow or by an external heat sink coupled to the top surface 35, cooling of power dissipating components, such as MOSFET power switches 448, is enhanced by placing the devices on the top surface of the circuit board 442, in close proximity to the large top surface 35. On the other hand, energy storage elements, such as ceramic capacitors (e.g. 456, 458) do not generate as significant an amount of heat, but are thicker and thus require greater headroom. Such components are preferably located on the bottom surface of the circuit board where greater package headroom is provided. In a preferred embodiment, the upper portion accommodates components with a height of less than 1.2 mm and the lower portion accommodates components with a height of less than 2.0 mm.

The top and bottom surfaces of the circuit board may be encapsulated in thermally conductive epoxy (e.g., EME-LK4-2, manufactured by Sumitomo Bakelite Co. Ltd.) to form the upper and lower portions, e.g., the parallelepiped upper and lower portions 36, 31 shown in FIGS. 3 and 4. The outer surfaces of the encapsulating material may form the outer surfaces of upper portion 36 and lower portion 31 including top surface 35 (as indicated by dashed lines 336) and bottom surface 34 (as indicated by dashed lines 331) shown in FIGS. 5A and 5B. With allowance within the upper portion for components with a height of less than 1.2 mm, the average thermal resistance between the top surface of the circuit board and the external top surface of a package encapsulated using the above referenced LK4-2 is approximately 1.6 C/Watt per square inch of the top surface of the circuit board. A portion of the circuit board 442 corresponding to the overhang surface 42 (regions 42a-42d) is left un-encapsulated to expose contact pads (e.g., contact pads 63 in FIG. 5B) to which interface contacts 33 (e.g., solder balls in a BGA, or other contacts) may be attached. The completed overhang package architecture, e.g., the dual rectangular-parallelepiped package illustrated in FIGS. 3, 4, and 5, provides electrical interconnect, mechanical mounting and thermal cooling advantages over existing package architectures lacking the overhang, e.g. a single rectangular-parallelepiped surface mount package.

In general, electrically, the package interconnect resistance and inductance are optimized by proximity of a multiplicity of interconnect elements to the components contained in the body of the package. Mechanically, the package optimizes the power density of the power converter by optimal allocation of relatively thinner semiconductor power devices in the upper portion of the package and relatively thicker energy storage components in the lower portion of the package. The effective power density of a system incorporating a power converter with this package is further optimized by the ability to insert the lower portion of the package within an aperture of an external circuit board while supporting the package over the circuit board with its overhang. Mechanical mounting flexibility is also provided by the ability to couple the package through an interposer or extender element to allow surface mounting over an external board, with the package body being parallel to the surface of the board. By using the volume under the package overhang, an interposer may be added without substantially raising the height of the overall package, both for low profile surface mounting and for vertical mounting with minimized footprint. Thermal management of the heat generated within the package is facilitated by the ability to extract heat by conduction or convection from the top surface of the package, with low thermal resistance to the semiconductor junctions contained within the upper portion of the package. Thermal management is also effectively provided by conduction into an external circuit board or interposer element, with low thermal resistance between the semiconductor junctions thermally coupled to the top surface of the circuit board and the interface contacts to the external circuit board, the removal of heat being facilitated by lateral conduction along the circuit board within the package to its interface contacts, or terminals, under the package overhang.

Interface contacts 33 (e.g., solder balls or brass balls in a BGA) may be applied to the contact pads 63 before or after encapsulation or over-molding. Individual solder balls may be applied to the contact pads to form a BGA using standard adhesive tape carrier, robot placement, or stencil methods. Because it is difficult in practice to operate a molding process without some resin bleed or flash occurring at the parting line of the mold and a parting line exists between the exposed overhang 42 and the encapsulated lower portion 31, resin bleed may adhere to the contact pads 63 preventing proper attachment of the interface contacts 33 without an additional process step to clean off the bleeding which would otherwise cause contamination of the contact pads. Attaching the contacts 33 before encapsulation avoids the need for a dedicated cleaning step. With pre-attached contacts, resin that bleeds around the base of the solder spheres will not interfere with the integrity of the BGA as long as the thickness of the bleeding film is substantially less than the diameter of the balls. The encapsulation-mold cavity may be designed to "step over" interface contacts 33 (e.g., solder balls in a BGA or other contacts) attached to contact pads 63 before the molding process.

Figure 14A:
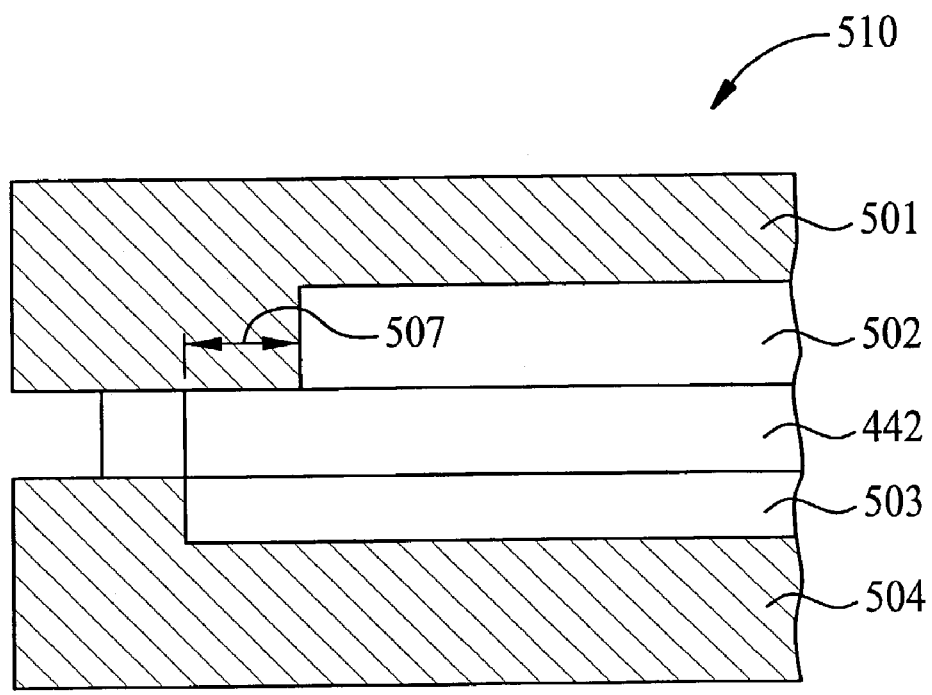
FIGS. 14A and 14B show, respectively, cross-sections of a mold without and with a step-over cavity for pre-attached interface contacts.
Figure 14B:
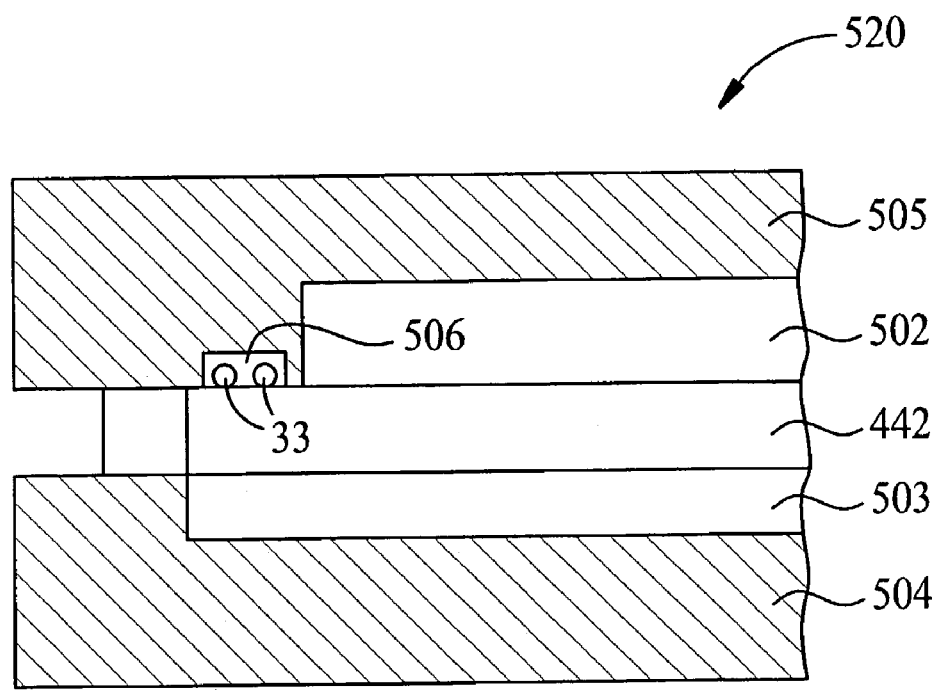

Referring to FIG. 14A, a cross-section of a mold 510 includes mold section 501 with cavity 502 which closes on the bottom surface of circuit board 442 and mold section 504 with mold section 503 which closes on the top surface of circuit board 442 to encapsulate, respectively, the lower portion 31 and upper portion 36. The exposed overhang surface 42 of circuit board 442 mates with mold section 501 in the area indicated by reference designation 507 in FIG. 14A. The mold 520 illustrated in FIG. 14B includes a step-over cavity 506 in mold section 505 to provide clearance for pre-attached solder spheres 33 as shown. The step-over cavity may be used with other types of interface contacts also. The overhang surfaces in regions between previously attached interface contacts 33 (e.g., LGA or BGA contacts) may be encapsulated in alternative embodiments.

The packaging architecture described with reference to FIGS. 3, 4, and 5 is not limited to packages having upper and lower portions that are generally parallelepiped in shape. The above described encapsulation method of forming the upper and lower portions is particularly well suited to fashioning the upper and lower portions in virtually any shape (e.g., polyhedral, cylindrical, etc.). In the case of a generally parallelepiped upper region, the package may advantageously include interface contacts on all or a portion of its overhang surfaces. Specifically, the overhang surface may be formed on a multiplicity of sides (e.g., 2, 3, etc.) of the parallelepiped. In embodiments where the upper region is not generally parallelepiped in shape, the interface contacts can be arranged anywhere along the overhang region.

Figure 6A:
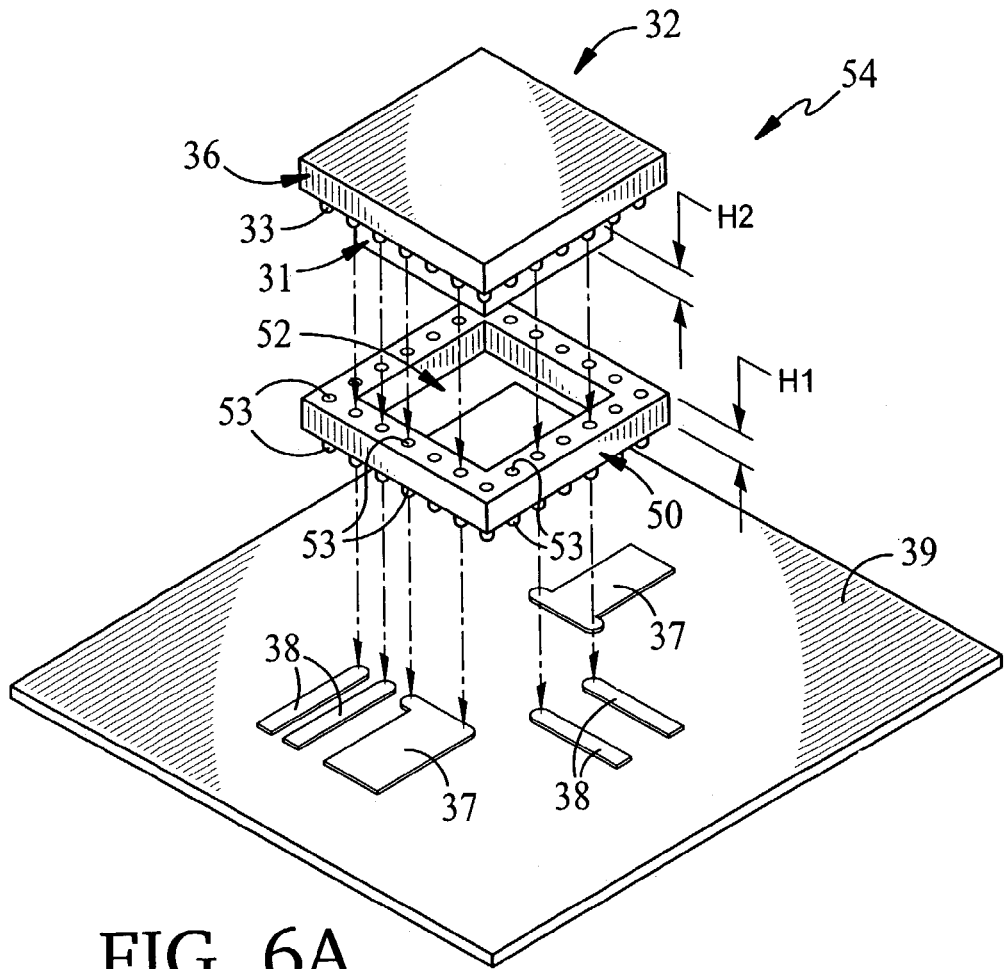
FIGS. 6A and 6B show, respectively, an exploded perspective view and a perspective view of a power converter apparatus comprising an interconnect extender according to the invention.
Figure 6B:
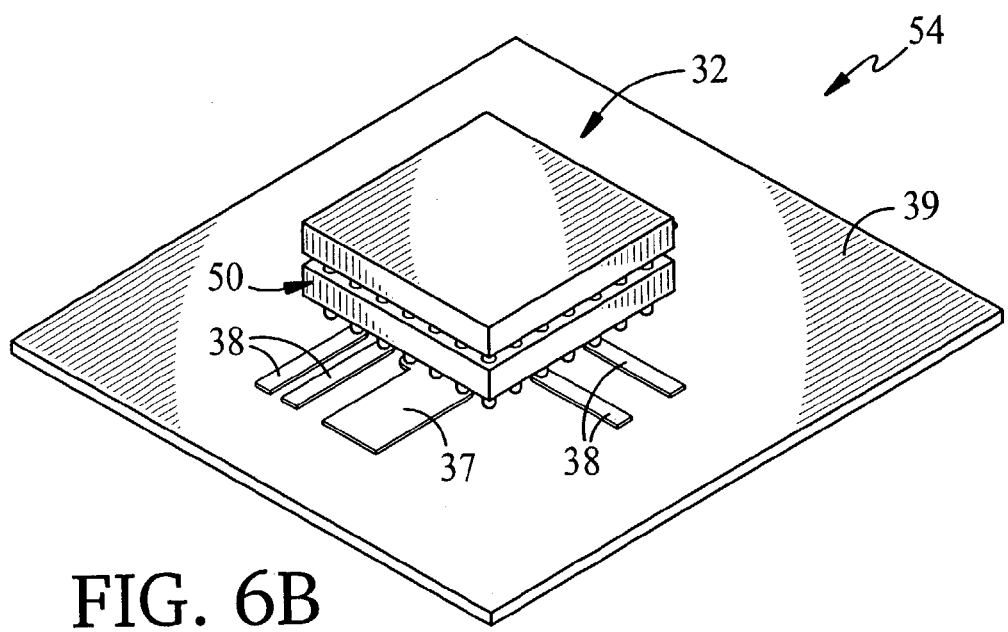

In applications where it is not possible or desirable to use "through the board" mounting, the overhang package may be mounted above the surface of the circuit board in an "on board" configuration using an interposer such as an interconnect extender. FIGS. 6A and 6B show, respectively, an exploded perspective view and a perspective view of a power converter apparatus 54 comprising a power converter 32 packaged in an overhang package of the kind described above, a circuit board 39, and an interconnect extender 50. Interconnect extender 50 has an aperture 52 for accommodating the lower portion 31 of the overhang package and extender contacts 53, which connect contacts 33 on the converter 32 to conductive runs 37, 38 on the circuit board 39. The height, H1, of the extender 50 is preferably greater than or equal to the height, H2, of the lower portion 31 of the power converter under all reasonable tolerance conditions to provide the required clearance between the bottom surface 34 and the circuit board 39.

Figure 7:
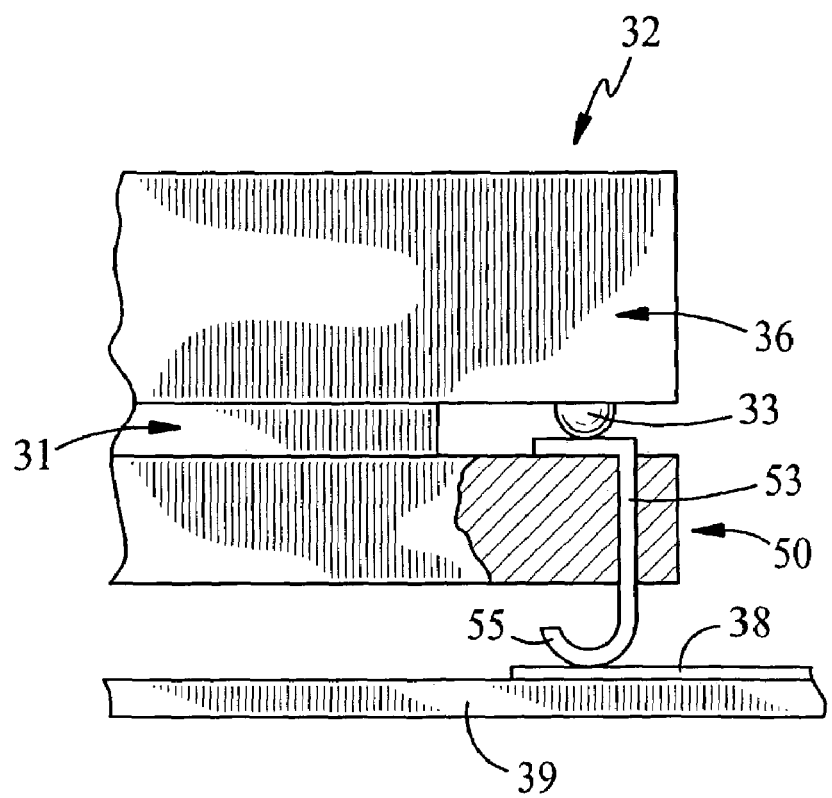
FIG. 7 shows a cross-sectional view of a portion of a power converter apparatus comprising an interconnect extender according to the invention.

The interconnect extender 50 may also be used to provide a variety of alternative lead terminations to the power converter. Referring to FIG. 7, a cross-sectional view of a portion of a power converter assembly comprising a packaged power converter 32 of the kind described above, a circuit board 39 with a conductive run 38 and an interconnect extender 50 is shown. The end 55 of the extender contact 53 that attaches to the conductive run 38 on the circuit board 39 is in the form of a "J" lead. Alternatively, other lead terminations, such a through-hole leads or gull-wing terminations may be used.

Figure 8:
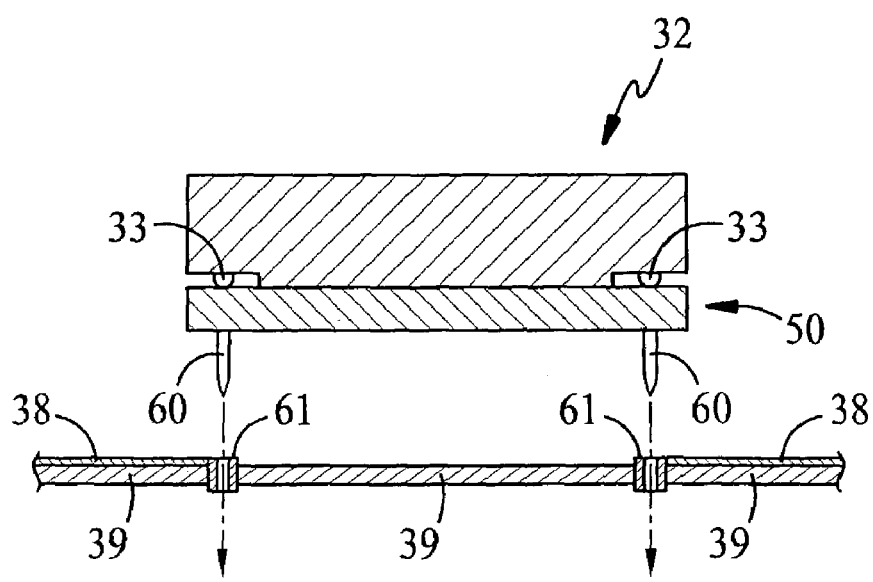
FIG. 8 shows an exploded cross sectional view of a power converter apparatus comprising an interconnect extender and a pin and socket arrangement.

An interconnect extender may also be used to create a plug-and-socket connection between a packaged converter, of the kind described above, and a circuit board assembly. Referring to FIG. 8, an exploded cross-sectional view of a power converter apparatus using an interconnect extender 50 with extender pins 60 is shown. The top ends of the extender pins (not shown) are soldered to the interface contacts 33 on the power converter 32 in a manner similar to that shown in FIG. 7. The lower ends of the pins 60 extend from the bottom of the interconnect extender 50, and may be inserted into sockets 61 that are themselves soldered to runs 38 on circuit board 39. Although FIG. 8 shows the power converter 32 and extender 50 assembly as an "on-board" mounting arrangement, the plug-and-socket technique may also be used in "through the board" applications by reducing the height H1 of the extender 50 (FIG. 6A) to less than the height H2 (FIG. 6A) of the lower portion 31 allowing the lower portion to protrude into the plane of the circuit board.

Figure 9A:
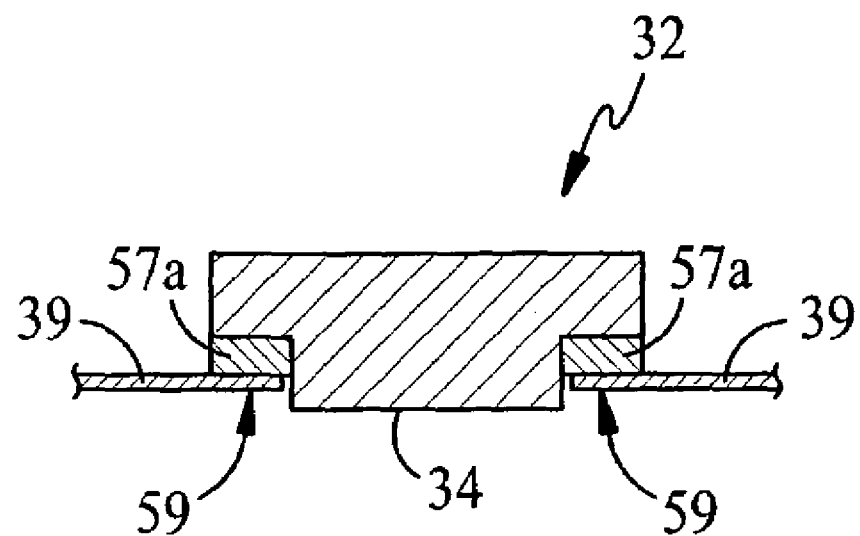
FIGS. 9A and 9B show cross-sectional views of different embodiments of the power converter apparatus of FIG. 6.
Figure 9B:
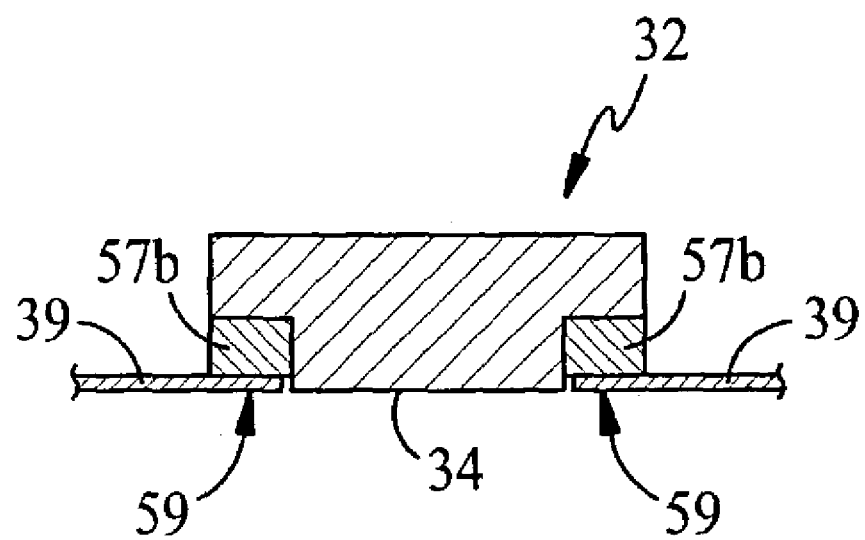

The interconnect extender may also be used in "through the board" configurations to vary the extent to which the power converter body protrudes down into the mounting surface e.g., the depth to which the lower portion 31 extends into or through the circuit board. For example, FIGS. 9A and 9B show cross-sectional views of portions of two power converter assemblies: the assembly in FIG. 9A uses an extender 57a which is shorter in height than the extender 57b of the assembly of FIG. 9B. As a result, the distance from the bottom surface 34 of the power converter 32 to the bottom surface of the circuit board 59 is smaller in FIG. 9B than it is in FIG. 9A. Adjusting the relative extensions of the top and bottom surfaces of the power converter 32 relative to the surfaces of the circuit board 39 may be used to adjust relative airflow across the top surface and bottom surface of the converter.

In embodiments in which a plurality of interface contacts 33 of a fixed size is used (e.g., interface contacts of the ball-grid array type), the current carrying capacity of an individual contact may be relatively low. In such cases, a plurality of contacts can be used together to create a high current interface. Input terminals may be located on one side of the package and output terminals may be located on the opposite side. With the package having a rectangular shape, including a long side and a short side, it is desirable to locate the input and output contacts along the long sides. This increases the proximity between the interface contacts and the innards of the package to which and from which currents need to flow and it reduces the thermal resistance between semiconductor junctions within the package and its interface contacts.

Some benefits of the power conversion package and apparatus described above are: small size; high interface contact density owing to the availability of the periphery of the package in the region of the overhangs 42 for placement of interface contacts; exposure of two large surfaces e.g. top and bottom surfaces 34, 35, for heat removal and cooling, the two surfaces representing a significant percentage of the total package surface area; generally high equivalent power density owing to a portion of the package being coextensive with the thickness of the circuit board 39; short, direct, interface connections between the converter and the circuit board, resulting in relatively low resistance and inductance in the electrical connections; and flexibility and ease of assembly in both "through the board" and "on board" applications.

Figure 10:
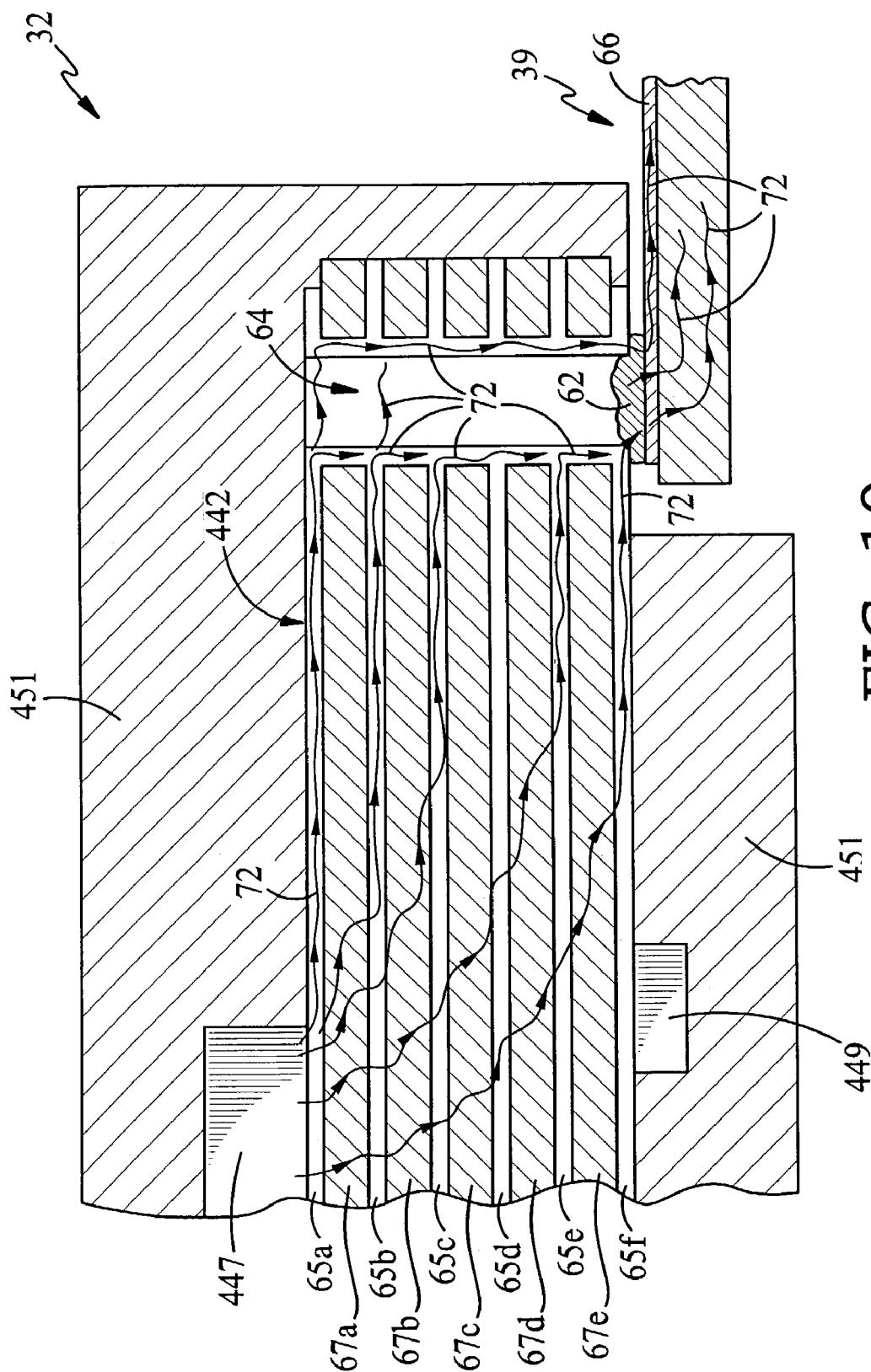
FIG. 10 is a partial cross sectional view of a power converter apparatus showing heat flow between components in a power converter and a circuit board.

Heat removal from the power converter package, specifically from power dissipating components contained within the package, may be provided using the printed circuit board 442 and the interface contacts 33 of a converter embodiment of the kind shown in FIG. 5. Referring to FIG. 10, a power converter 32, of the kind shown in FIG. 5, is shown mounted to a circuit board 39 in cross-section. The converter 32 includes a multilayer PCB 442 and circuit components (e.g., components 447, 449 mounted on, respectively, the top and bottom surfaces of multilayer PCB 442) encapsulated in thermally conductive epoxy 451. Features in FIG. 10—in particular, the relative thicknesses of PCB 442 and circuit board 39—are not drawn to scale. The multilayer board 442 may include several alternating layers of conductive runs (e.g., conductive runs 65a through 65f) and insulating layers (e.g., insulating layers 67a through 67e), which may comprise, for example, impregnated fiberglass substrates or ceramic substrates. The conductive runs 65 form connections between circuit components mounted on the top and bottom surfaces of the PCB 442 and between converter circuitry and interface contacts 33 shown in FIG. 10 as solder connection 62 representing a portion of a reflowed BGA. Solder connection 62 connects conductive run 67f, on the bottom of multilayer PCB 442, to a conductive run 66 on circuit board 39.

In FIG. 10, a heat-dissipating component 447 is mounted onto conductive run 65a on the top surface of multilayer printed circuit board 442. As indicated by the arrows 72 in the Figure, heat flows both vertically and horizontally from the component 447 into the multilayer board 442. A metallic plated-through via 64 participates in conducting the heat down through solder connection 62 into conductive run 66 on circuit board 39.

The effectiveness of the heat removal technique illustrated in FIG. 10 may be illustrated with the following example in which a power converter comprising heat-dissipating components is assumed to dissipate heat approximately uniformly over the top surface of a multilayer board. Assuming that the multilayer board measures 0.82 inch (21 mm)×1.26 inch (32 mm) along the edges, consists of fourteen layers of 2-ounce copper (approximately 0.085 inch (2.16 mm) thick) etched into conductive runs and separated by thirteen 0.004 inch (0.16 mm) thick relatively high thermal conductivity (2.5 Watt/m-C) insulating layers, the "effective thermal resistance" between the top surface of the multilayer board and the two long edges of the package will be of the order of 1 C/Watt. Dielectric substrate (pre-preg) materials incorporating a thermally conductive filler, such as ceramic, may be used to fabricate thermally conductive printed circuit boards. For example, T-Lam available from Thermagon, Inc., 4707 Detroit Avenue, Cleveland, Ohio 44102-2216, and Thermal-Clad available from The Bergquist Company, 18390 W. 78th Street, Chanhassen, Minn. 55317 may be used. Assume that a ball-grid array consisting of 108 solder balls 0.75 mm in diameter is used for interface contacts 33 on the overhang surface and the solder balls are reflowed to form solder joints between conductive runs on the bottom surface of the multilayer board (e.g., run 65f, FIG. 10) and conductive runs on a circuit board (e.g., run 66, FIG. 10). Each resulting solder joint (e.g., solder joint 62, FIG. 10) will have a thermal resistance of approximately 20 C/Watt. The BGA (consisting of 108 such solder balls) will therefore contribute a thermal resistance of approximately 0.2 C/Watt. The total "effective thermal resistance" between the top layer of the multilayer board 442 and the circuit board 39 will be approximately 1.2 Watt/C (or, 16 C/Watt per cm of periphery, given a periphery of 13.5 cm). With a thermal load of less than 10 Watts, the "average" temperature rise between the top surface of the multilayer board 442 and the solder joint 62 on the run 66 on the circuit board 39 can be kept below 12 C allowing for effective and low cost thermal management of the converter.

Figure 1:
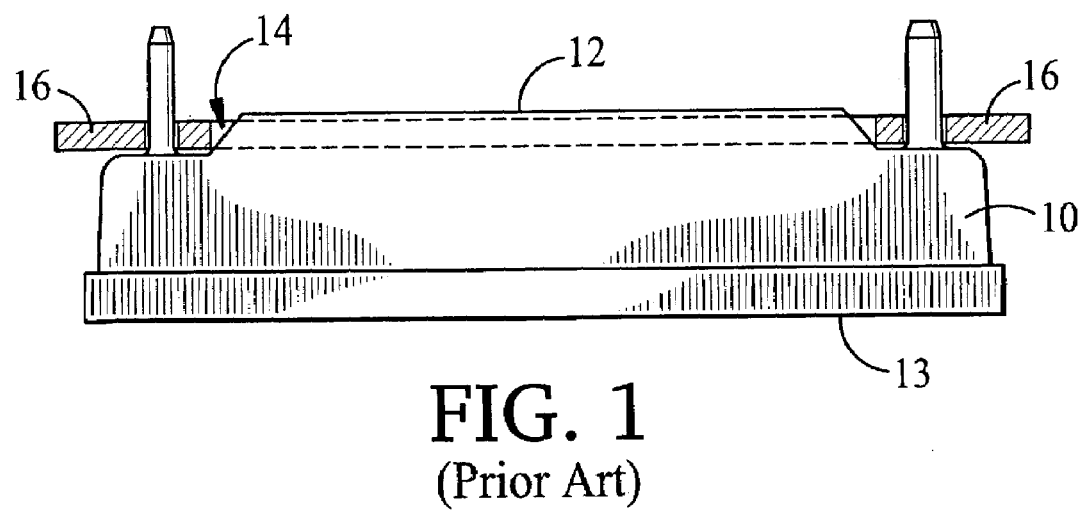
FIG. 1 shows a prior art power conversion apparatus.
Figure 2A:
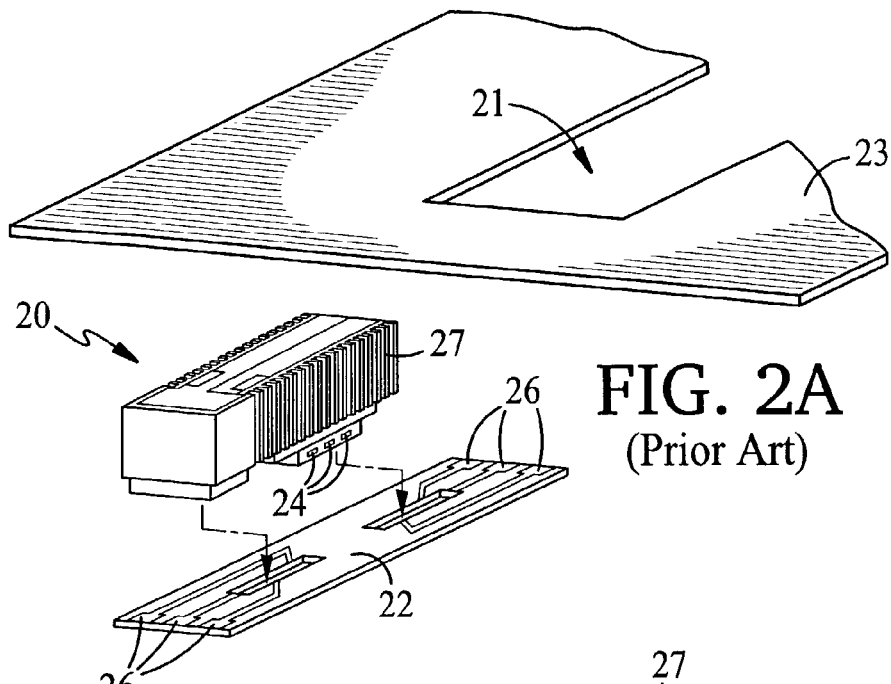
FIGS. 2A-2C show, respectively, an exploded perspective view, a cutaway perspective view and a side view of another prior art power conversion apparatus.
Figure 2B:
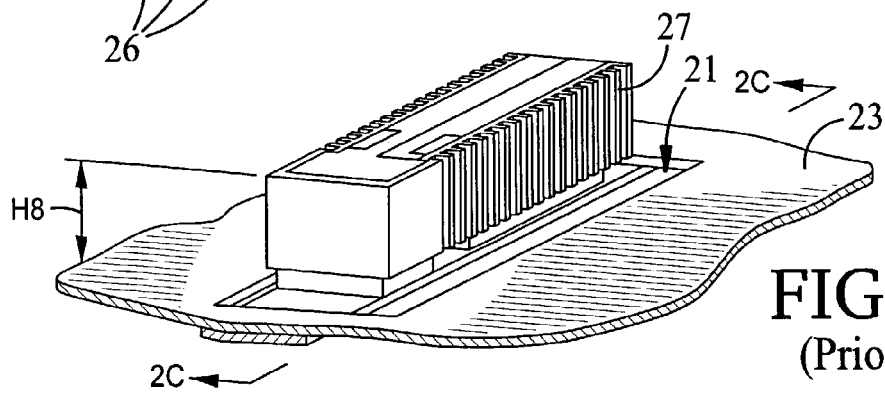
Figure 2C:
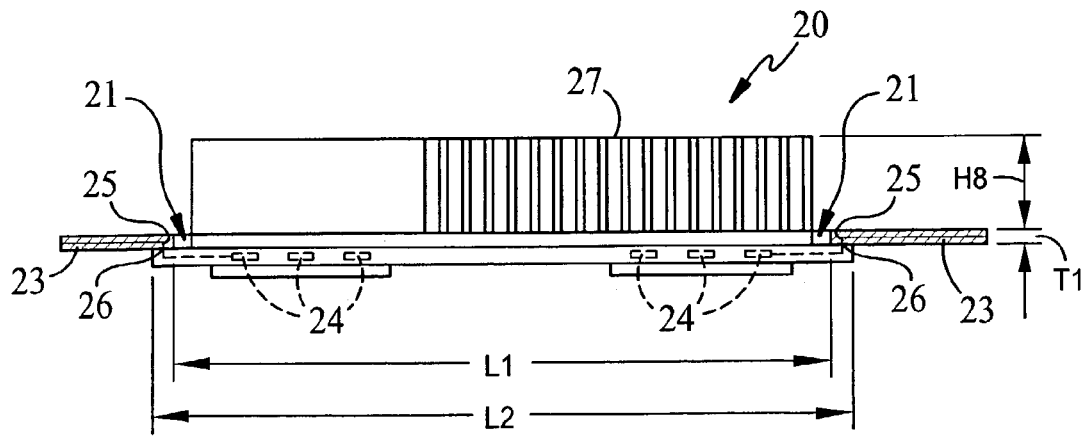
Figure 11A:
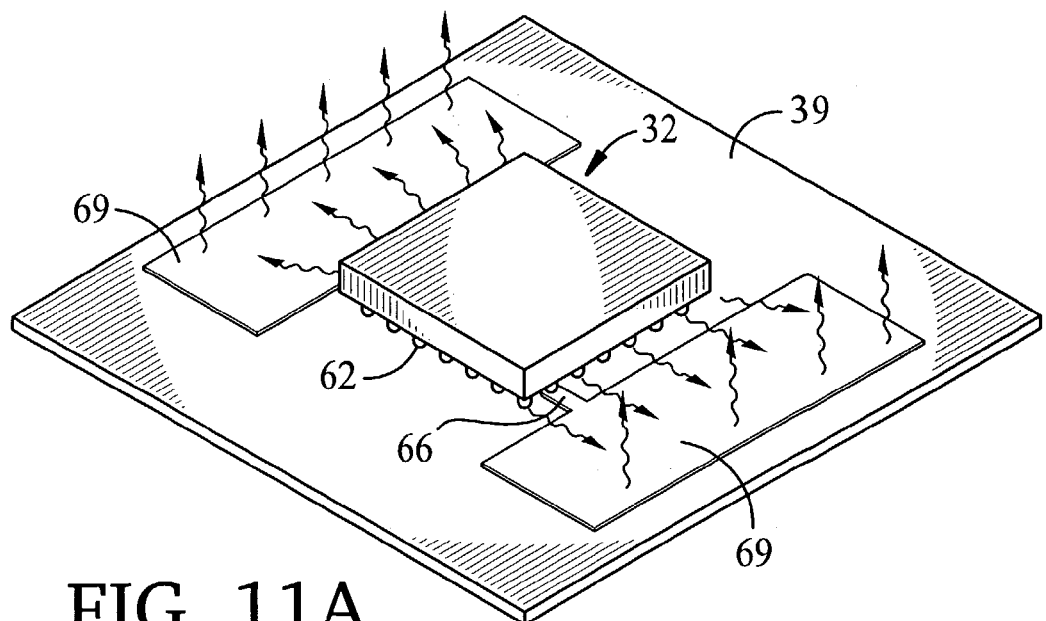
FIGS. 11A and 11B show, respectively, perspective views of power converter apparatus that is connected to a circuit board and cooled by a heat sink attached to the circuit board.

Heat conducted from the converter 32 into the circuit board 39 may be exchanged with the surrounding system in a variety of ways. Referring to FIG. 11A, the surface area of the circuit board may be sufficient, when combined with the surface area of the top and/or bottom surfaces of the converter 32, to exchange heat with the surrounding air as a means of cooling the converter in some applications. The wavy arrows in FIG. 11A represent the flow of heat from the power converter 32, through the solder joints (e.g., solder joint 62), into the circuit board 39, and into the surrounding environment. As shown, the spreading of heat may be enhanced using highly thermally conductive metal runs 69 on the circuit board 39. Heat is removed from the surfaces of the circuit board 39, runs 69, and from the surfaces of the converter 32, by free or forced convection. Although only the top surfaces of the converter 32 and circuit board 39 are shown in FIG. 1A, the bottom sides of the converter 32 (in through the board applications) and the bottom side of the circuit board 39, and conductive runs thereon, may contribute to the transfer of heat into the environment.

Figure 11B:
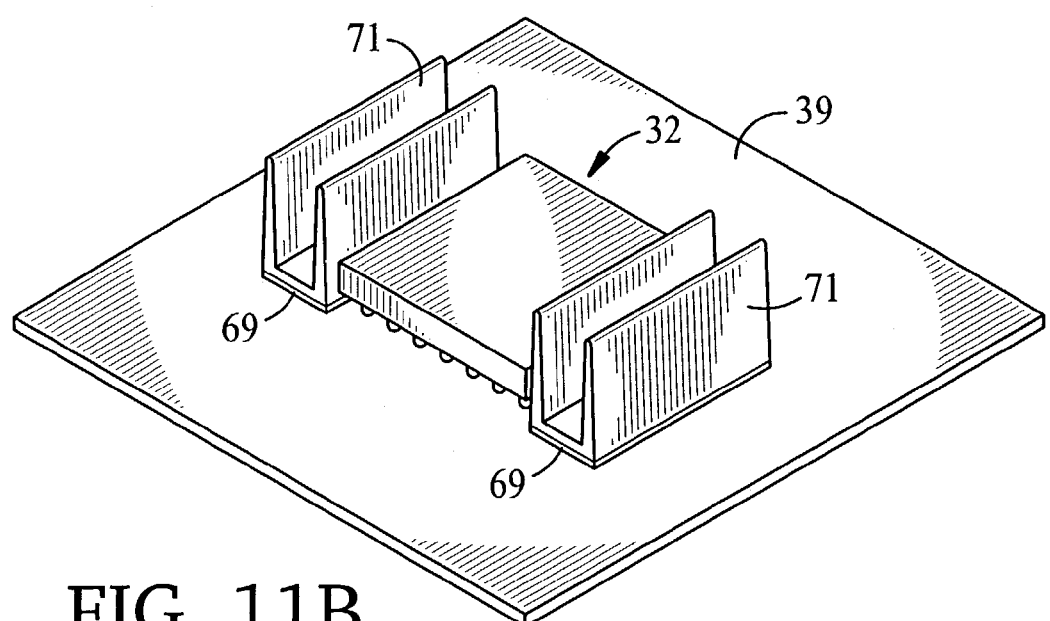

Alternatively, one or more small heat sinks may be deployed along the sides of the converter package. Referring to FIG. 11B, two heat sinks 71 are shown, for example, surface mounted (e.g., by use of solder or thermally conductive adhesive) to conductive runs 69 on circuit board 39. The heat sinks 71 may have the same height or be taller or shorter than the converter 32 depending upon the application. Using heat sinks, which provide substantial surface area for heat convection while occupying relatively little surface area on the circuit board 39, adjacent to the converter package is more space efficient in comparison to the technique of FIG. 11A. The adjacent heat sinks reduce the distance over which the heat flows in the circuit board 39 further improving heat transfer between the converter and the environment over the embodiment of FIG. 11A. Although shown mounted to the top surface, heat sinks 71 may be mounted to the bottom surface of the circuit board 39 instead of or in addition to heat sinks on the top of the circuit board. Either or both of the top and bottom surfaces of the converter 32 may aid in heat removal. Additionally, heat sinks may be attached to any or all of the top, bottom, and side surfaces of the power converter to further improve heat transfer to the environment. Free or forced convection may be used.

Furthermore, having conducted heat from the power converter to the external circuit board as exemplified in FIG. 10, heat may be removed from the external circuit board by conduction through heat sinks connected to other parts of the system. For example, a heat sink may be connected between the top surface of the external circuit board and a cold plate located above the top surface of the circuit board. Alternatively, a heat sink may be connected between the bottom surface of the external circuit board and a cold plate located below the bottom surface of the circuit board.

Figure 12A:
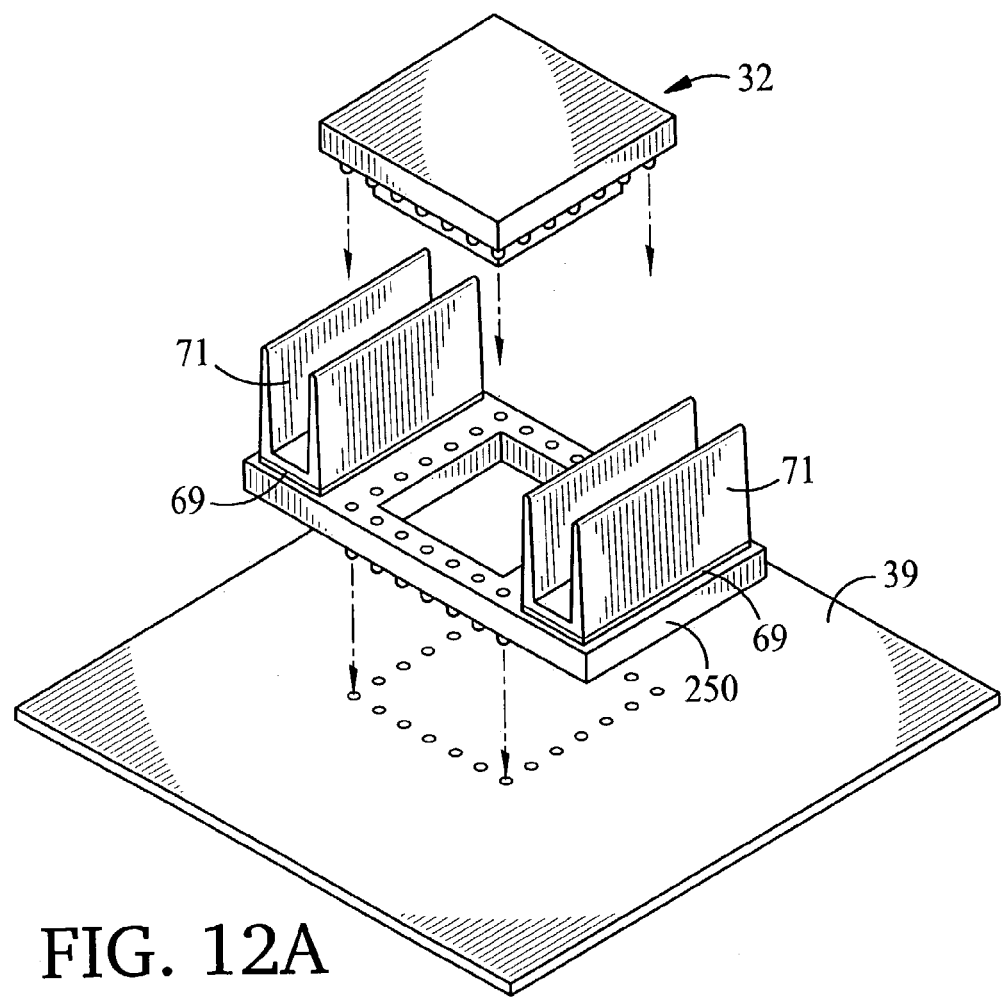
FIGS. 12A and 12B show an exploded perspective view and perspective view of power converter apparatus comprising a thermal extender.

The thermal management techniques discussed above in connection with FIGS. 10 and 11 may be adapted to applications in which an interconnect extender is used. Referring to FIG. 12A, an interconnect extender 250 may be adapted to provide, in addition to electrical interconnections to an external circuit board, low thermal resistance to a heat sink. Such a thermal extender may incorporate a heat sink to remove heat from the power converter and exchange it with the surrounding air. A thermal extender reduces the total thermal resistance between the power converter and the system surrounding it. One or more heat sinks 71 may be surface mounted to runs 69 on the top surface of the interconnect extender 250. The power converter 32 may be connected to the interconnect extender 250 using a BGA or LGA. The interconnect extender 250 is preferably connected to the top surface of circuit board 39 using a BGA, LGA, or alternative lead terminations, as previously described. The heat sinks in FIG. 12A will operate essentially as described above with respect to FIG. 11B, except that the heat is conducted from the power converter 32, through the solder joints (not shown), along conductive runs 69 on the extender (rather than on the circuit board), out through the heat sinks 71 into the environment. The interconnect extender 250 may be constructed using materials similar to those described above in connection with circuit board 442 in FIG. 10.

Figure 12B:
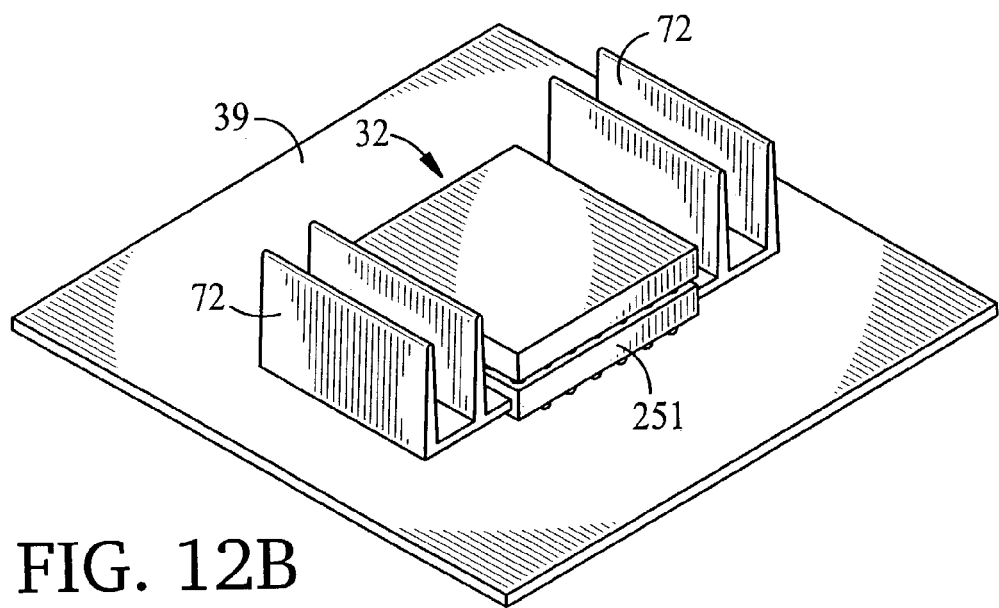
Figure 13:
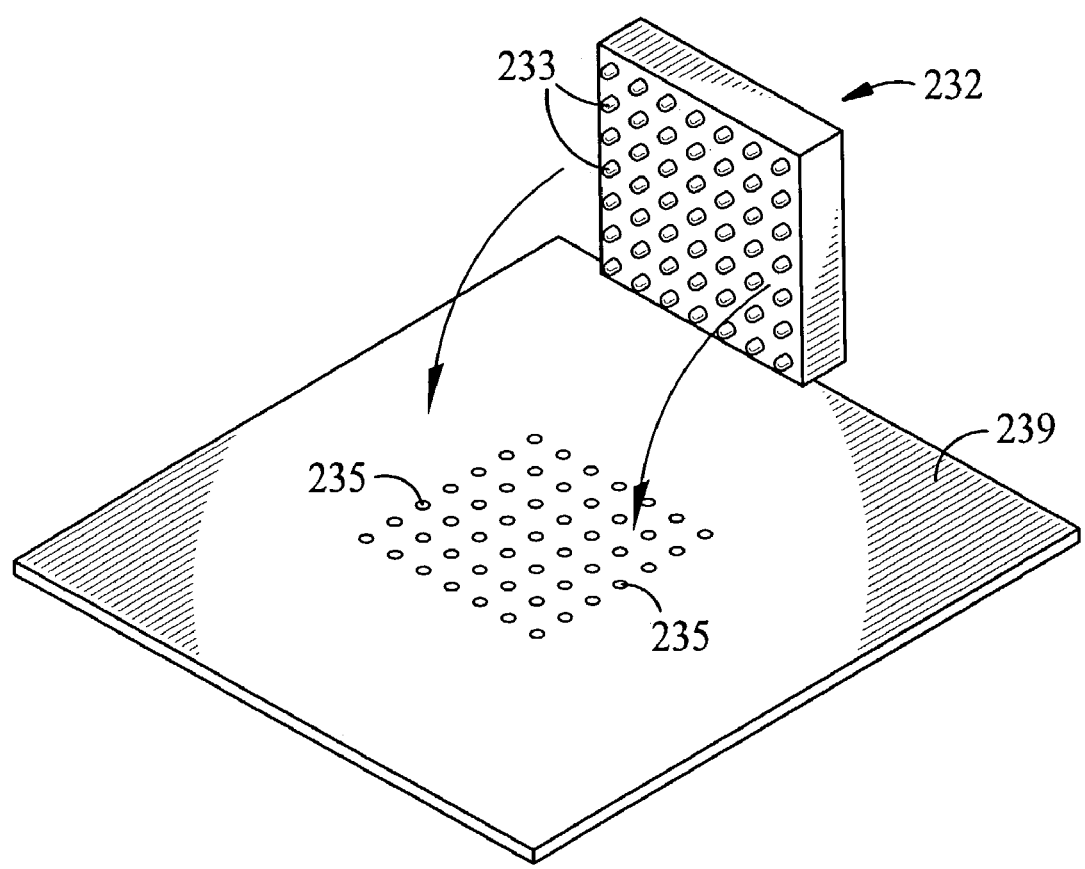
FIG. 13 shows an exploded perspective view of a prior art package comprising a ball grid array.

An alternative thermal extender with heat sink elements is shown in FIG. 12B. Referring to FIG. 12B, the thermal extender 251 may be molded or otherwise constructed using a high thermal conductivity material (such as CoolPoly from CoolPolymers Inc., 333 Strawberry Field Rd., Warwick, R.I. 02886 USA). Such thermally conductive plastics (e.g., CoolPoly D, a thermally conductive liquid crystalline polymer) achieve thermal conductivities of the order of 15 W/mK, allowing effective heat transfer with relatively low thermal gradients. While cooling effectiveness may be comparable to metals, thermally conductive plastics are lightweight, moldable and insulating. In these embodiments, heat sink elements 72 may be molded as extensions of the base of the thermal extender 251, instead of being discrete surface mount heat sinks attached to the surface of the extender, as discussed above in connection with FIG. 12A. With the base of the thermal extender being a dielectric material, electrical interconnect elements may be incorporated into the extender by inserting metal pins, such as brass pins, within holes or other features molded within the base of the extender. The fabrication of the extender, including insertion of the interconnect elements, may be realized using processes similar to those utilized in fabricating electrical connectors. By providing thermal extenders (e.g., extenders 250 of FIGS. 12A and 251 of FIG. 12B) which use a variety of different heat sink configurations 71, a supply of otherwise identical converters 32 may be adapted to operate in different thermal environments by appropriate selection of the extender.

Advantages of the thermal management techniques shown in FIGS. 10, 11 and 12 include allowing for a very low profile system, including the circuit board; avoiding the need to attach one or more heat sinks to the top and bottom surfaces of the converter 32 while still effectively using these surfaces for heat exchange; and flexibility in rapidly adapting a supply of converters to different circuit boards and environments.

It may be desirable in some applications to mount the power converter 32 vertically. Several problems with vertically mounting a power converter to a printed circuit board include providing mechanical stability during soldering (preventing it from falling over or shifting positions) and for the life of the product (shock and vibration endurance), and maintaining the integrity of the solder connections between the power converter 32 and a vertical mount interface extender while the vertical mount assembly is being soldered to a customer PC board.

Figure 15A:
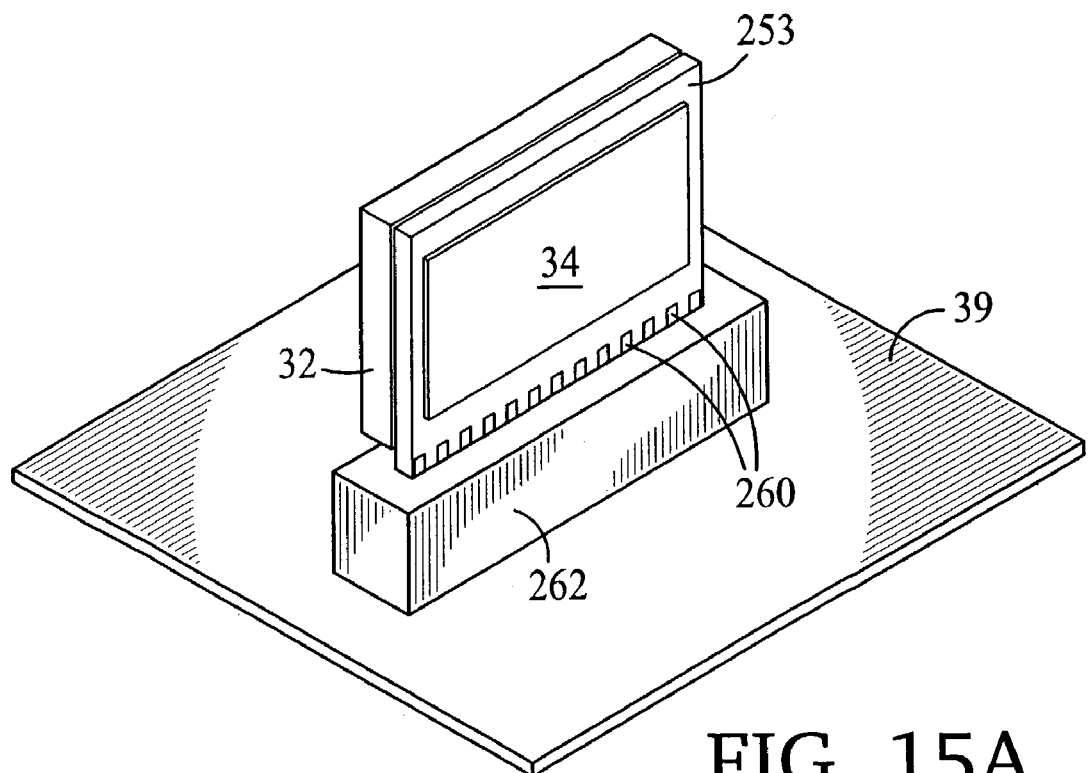
FIGS. 15A and 15B show, respectively, perspective and side views of a power converter mounted to a circuit board via a vertical interconnect extender and card-edge connector.
Figure 15B:
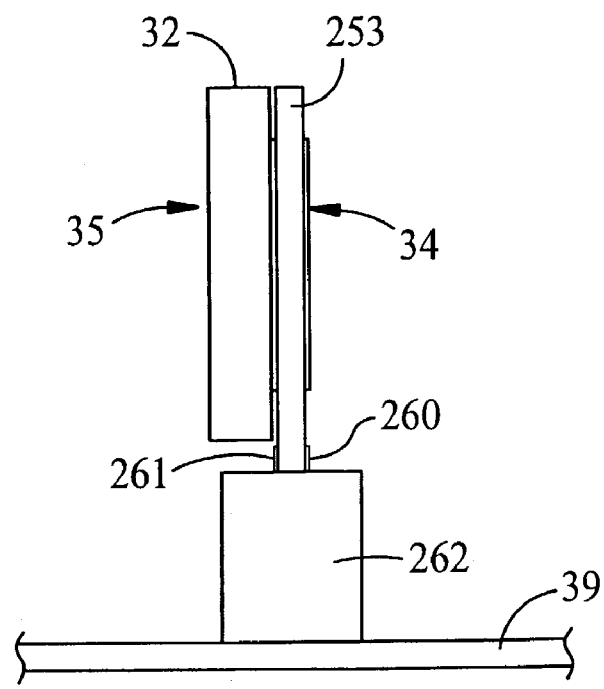

One vertical mounting technique which solves these problems is shown in FIGS. 15A and 15B. Referring to FIGS. 15A and 15B, a power converter 32 is mounted to an interconnect extender 253, which may be a printed circuit board. The power converter 32 is shown mounted to the extender 253 in a through the board configuration similar to that shown in FIGS. 3A and 3B. The bottom surface 34 of the lower portion of the converter 32 is shown extending through an aperture in the interconnect extender 253 in FIG. 15A. The upper surface 35 of the converter can be seen in FIG. 15B. Interconnect extender 253 includes contacts e.g., edge-finger contacts 260, 261, arranged along an edge of the extender on one or both sides of the extender for mating with a connector 262, e.g., a card edge connector. The contacts 260, 261 may be connected via conductive runs (not shown) to interface contacts (e.g. interface contacts 33 in FIG. 3A) on the power converter 32. The card edge connector 262 may be soldered to conductive runs on circuit board 39 using surface mount or other techniques.

Although the card-edge connector technique of FIGS. 15A and 15B provides the necessary mechanical foundation and avoids problems encountered with soldering, it may be a relatively low-performance vertical mount solution from a number of points of view, such as thermal and electrical performance. The interconnect extender 253 of FIGS. 15A and 15B may further comprise heat sinks such as shown in FIGS. 12A and 12B.

Figure 16A:
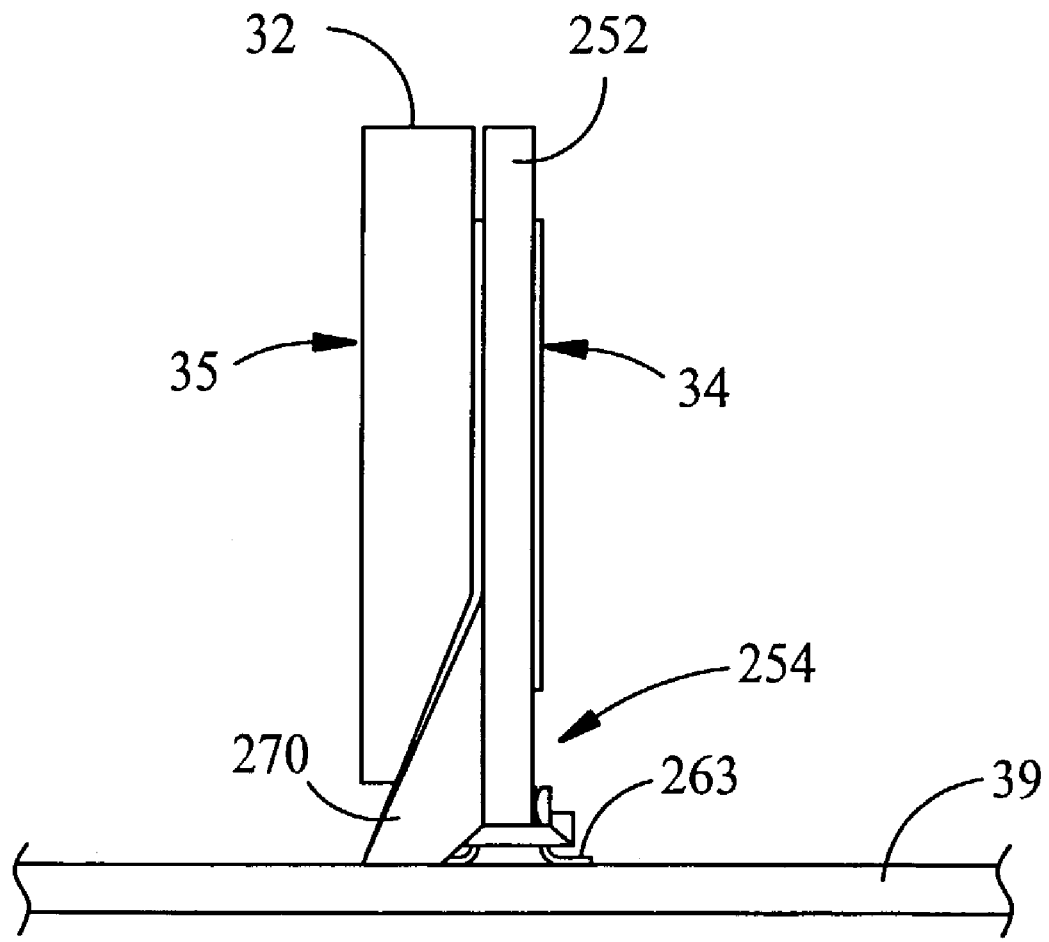
FIGS. 16A, 16B, and 16D show, respectively, side and perspective views of a power converter mounted to a circuit board using a vertical interconnect extender.
Figure 16B:
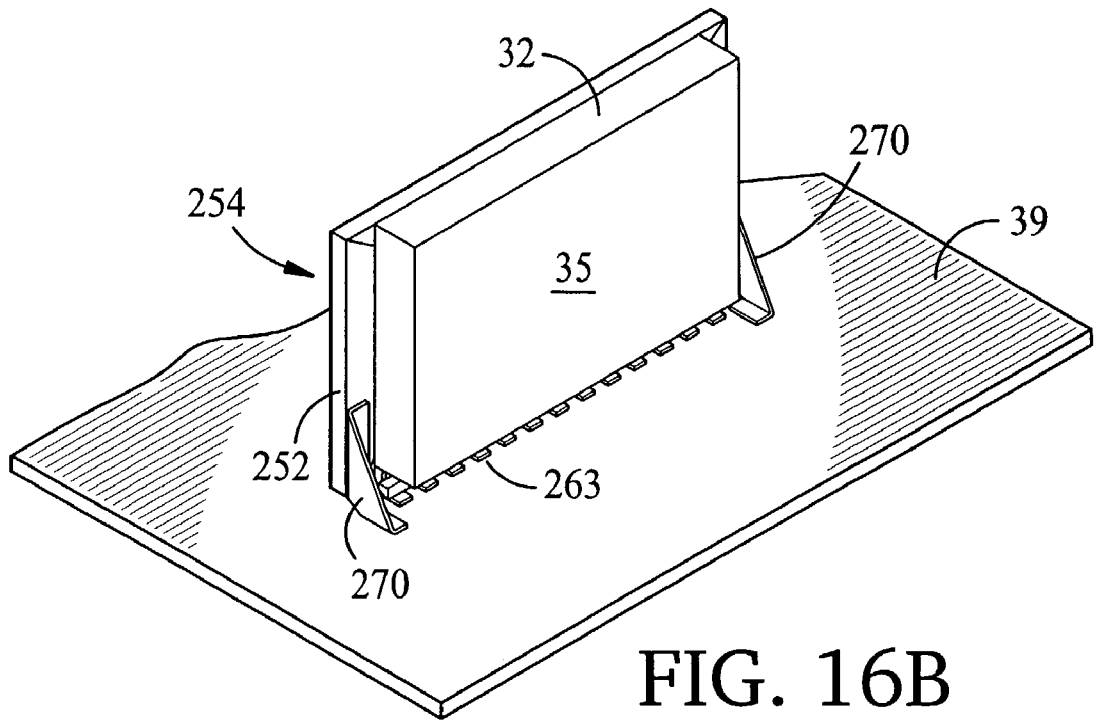
Figure 16C:
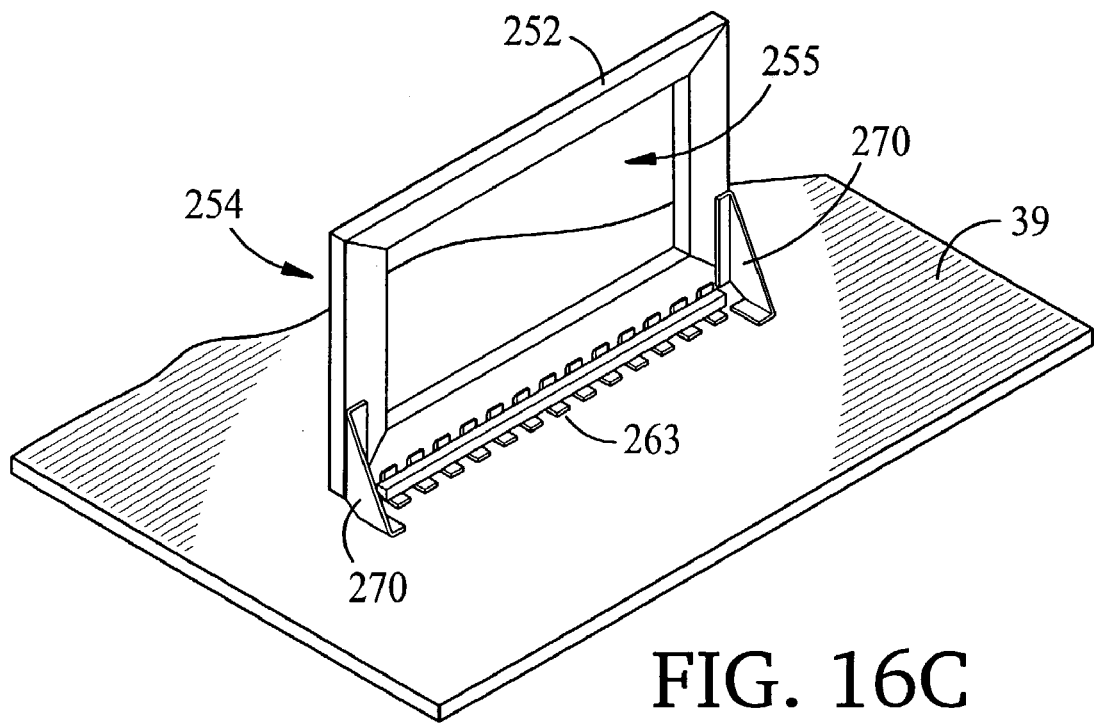
FIG. 16C shows a perspective view of a vertical interconnect extender.
Figure 16D:
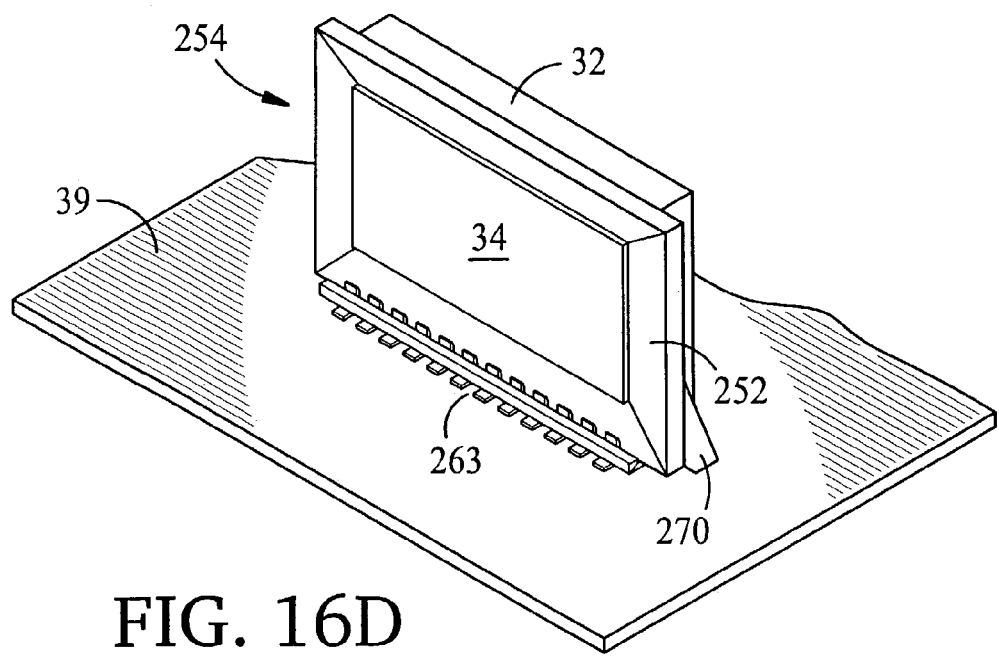

Alternatively, a vertical mounting interconnect extender adapted to be soldered to a PCB may be used. Referring to FIGS. 16A through 16E, a vertical interconnect extender 254 for supporting a power converter 32 is shown. Referring to FIG. 16C, the extender 254 includes a PCB 252 having an aperture 255 for accommodating the lower portion of the power converter 32 in a "through the board" mounting arrangement such as the one shown in FIGS. 3A, 3B. The bottom surface 34 of the converter 32 is shown extending through the interconnect extender 254 in FIGS. 16A and 16D. The interconnect extender 254 may use a PCB 252 similar to the extender 253 of FIG. 15, except that instead of mating with a card-edge connector, the vertical-mounting extender 254 includes leads 263 (shown in greater detail in FIG. 16F) e.g., NAS/Interplex "Dual Row Interconnect" formed for surface mount assembly to circuit board 39. The PCB 252 includes conductive runs (not shown) to connect the interface contacts on the power converter to the leads 263. The leads 263 may be soldered and adhesively bonded to the circuit board 252 for stability during subsequent soldering to circuit board 39. Thermal conductive gussets 270 may be provided to add mechanical stability and to decrease the thermal resistance between the extender and the circuit board 39. The gussets 270 may be mechanically attached (or soldered and adhesively bonded) to the circuit board 252 of extender 254 and soldered to pads (e.g. pads 271 in FIG. 16E) on circuit board 39. The gussets 270 and leads 263 help conduct heat away from the converter 32 and into the circuit board 39 similar to the techniques discussed above in connection with FIGS. 10-11. Heat sinks may be added to the extender 254, one or more surfaces of the power converter 32, or to the circuit board 39 as discussed above. A spring clip (not shown) or adhesive may be added to secure the power converter 32 to the above described interconnect extenders to provide mechanical stability during solder operations. Solder, having a melting point higher than that of the solder used to attach the vertical extender to the circuit board 39, may be used to attach the power converter 32, leads 263, and gussets 270 to the circuit board 252 to avoid problems during the later solder operations. The gussets may also be provided with features such as pins or fingers where they attach to the circuit board 39 or to PCB 252 to prevent sliding during assembly and soldering operations.

Figure 17A:
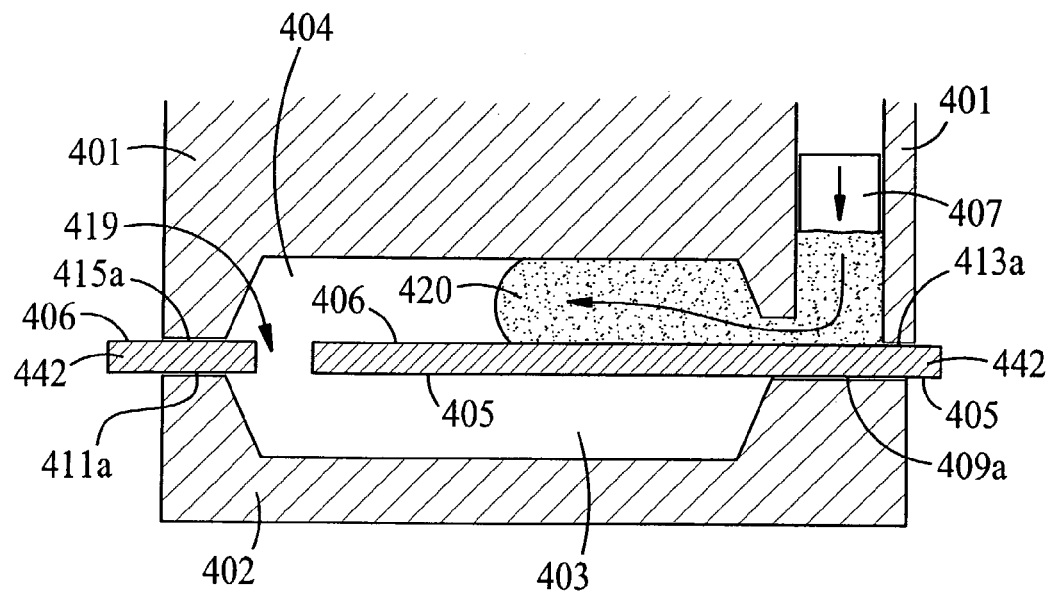
FIGS. 17A, 17B and 17C illustrate a molding apparatus and method.
Figure 17B:
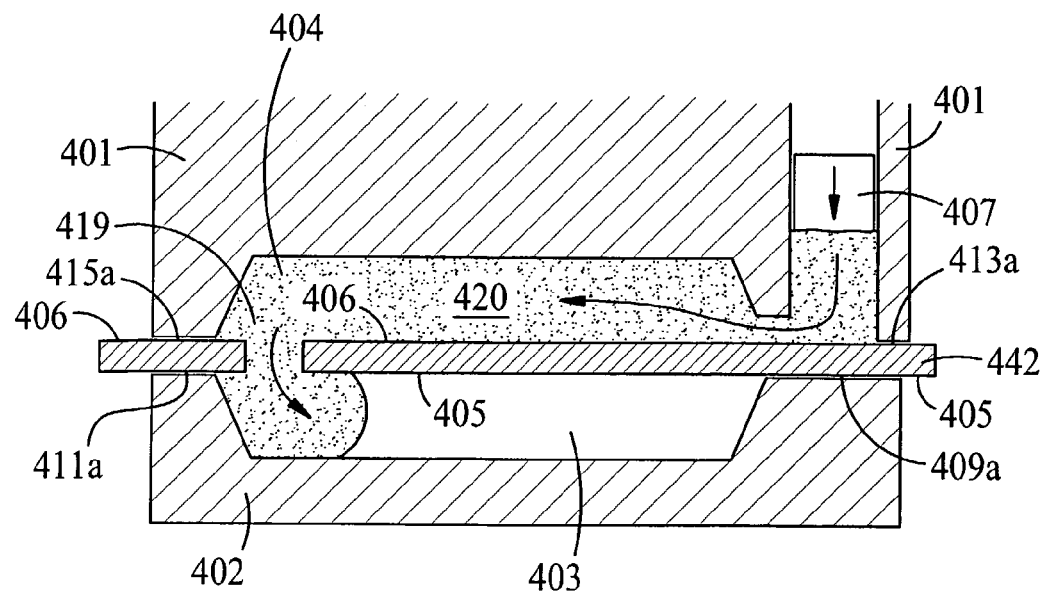
Figure 17C:
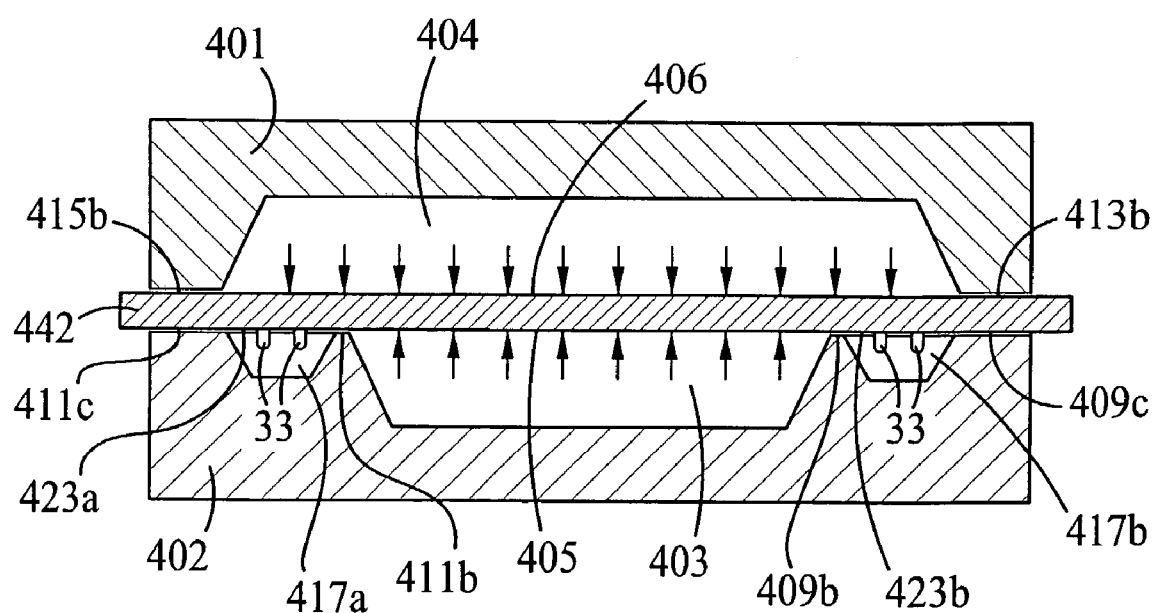
Figure 18:
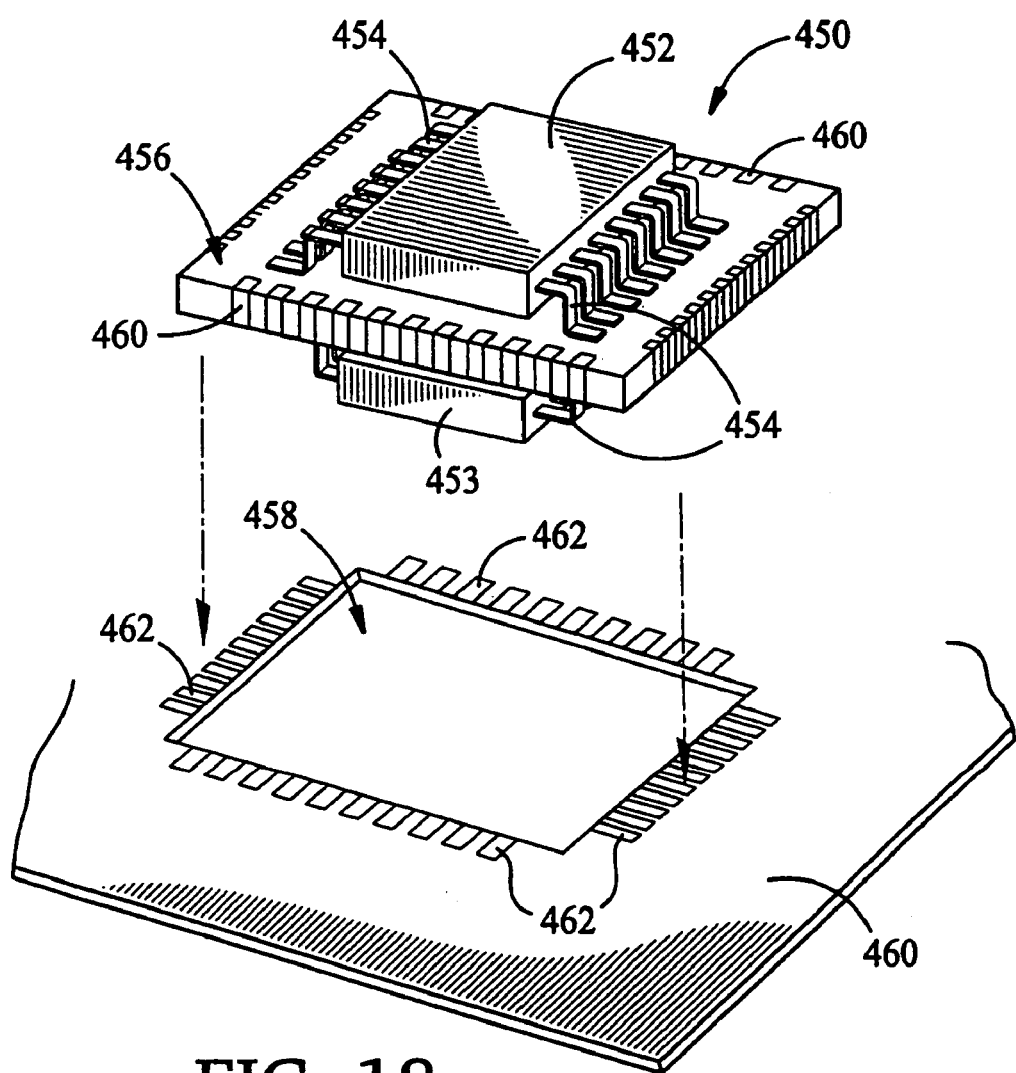
FIG. 18 shows an exploded perspective view of a prior art integrated passive network mounted over an aperture in a circuit board.

As described above, the upper and lower portions (e.g., the generally parallelepiped upper and lower portions 36, 31 shown in FIGS. 3A, 3B, 4A and 4B) may be formed by encapsulating the top and bottom surfaces of a circuit board. FIGS. 17A through 17C illustrate how the top and bottom surfaces of a printed circuit board may be encapsulated in a mold while leaving a predetermined area on one side of the board free of encapsulating material. The cross-sectional views of FIGS. 17A and 17B are taken at the same first location; the cross-sectional view of FIG. 17C is taken at a second location which is at a right angle to the cross section of FIGS. 17A and 17B.

Referring to FIGS. 17A and 17B, upper mold section 401 forms an upper cavity 404 above the top surface 406 of printed circuit board 442 and is in contact with the top surface 406 of the printed circuit board 442 at upper contact regions 413a, 415a. Likewise, lower mold section 402 forms a lower cavity 403 below the bottom surface 405 of printed circuit board 442 and is in contact with the bottom surface 405 of the printed circuit board 442 at lower contact regions 409a, 411a. Referring to the cross-section of FIG. 17C, the upper mold section 401 comes in contact with the top surface 406 of printed circuit board 442 at upper contact regions 413b, 415b and the lower mold section 402 comes in contact with the bottom surface 405 of the printed circuit board 442 at lower contact regions 409b, 411b. Additionally, the lower mold section 402 may optionally come in contact with the bottom surface 405 of the printed circuit board 442 at lower contact regions 409c, 411c. Step-over cavities 417a, 417b in the lower mold section 402 provide clearance for BGA solder balls 33 (or other interface contacts) on the bottom surface 405 of printed circuit board 442. The upper mold cavity 404 is used to form an encapsulated upper portion (corresponding, e.g., to upper portion 36 in FIG. 4B) on the top surface 406 of the printed circuit board 442. The lower mold cavity 403 is used to form an encapsulated lower portion (corresponding, e.g., to lower portion 31 in FIG. 4B) on the bottom surface 405 of the printed circuit board 442. Since the regions 423a, 423b on the bottom surface 405 of the printed circuit board 442 are kept free of encapsulant, the surface area that is within the periphery defined by lower contact regions 409a, 409b, 411a, 411b on the bottom surface 405 of the printed circuit board 442 (the "lower region area") is smaller than the surface area that is within the periphery defined by upper contact regions 413a, 413b, 415a, 415b on the top surface 406 of the printed circuit board (the "upper region area"). As described below, the arrangement of the mold and the printed circuit board shown in FIGS. 17A-17C enables molding of the upper and lower portions while keeping contact regions 423a, 423b (under the step-over cavities 417a, 417b on the bottom surface of the printed circuit board 442) essentially free of encapsulant.

Referring to FIGS. 17A and 17B, movement of the plunger 407 forces liquefied encapsulating material 420 into the upper cavity 404 under pressure in the direction indicated by the arrows. As the flow of encapsulating material 420 fills the upper cavity 404, the pressure exerted by the encapsulating material on the top surface 406 of the printed circuit board creates a net downward sealing force which pushes the bottom surface 405 of the board against the lower mold section 402 along the periphery defined by the lower contact regions 409a, 409b, 411a, 411b. The net downward sealing force prevents encapsulating material from flowing into contact regions 423a, 423b. After the upper cavity 404 has filled with encapsulating material 420, the encapsulating material will flow into the lower cavity 403 via the conduit 419 formed in the printed circuit board 442 (FIG. 17B). Because the "lower region area" is smaller than the "upper region area," a net downward sealing force is maintained throughout the filling of the lower cavity 403 with encapsulating material 420, as illustrated by the solid arrows in FIG. 17C.

In certain open-frame applications, encapsulation within a package as described above may be unnecessary and there may be a benefit to exposing the components of the power converter to an external airflow to provide direct cooling of components. The open-frame applications may also benefit from various aspects of the invention described above, including those stemming from the use of interface contacts arranged within an overhang region on the bottom surface of the power converter circuit board. In particular, a BGA for making electrical connections to the power converter may be arranged within the overhang region and the power converter may be mounted by the BGA connection to an external circuit board. The circuitry on the bottom of the power converter may extend into an aperture in the external circuit board, to reduce the overall height the assembly while minimizing electrical and thermal interconnect impedances. The power converter of FIGS. 5 and 10 may be assembled and mounted without the package or encapsulation elements (shown as an outline in FIG. 5) for use in open-frame applications. The resulting open-frame power converter may be mounted to the external circuit board in the same manner as shown in FIG. 10 with the components (e.g. component 449) sitting in the aperture in the external circuit board (however, epoxy 451 would be omitted). The package outline (e.g. in FIGS. 5A, 5B) and encapsulation elements (e.g. in FIG. 10) shown in the figures may be viewed as an outline of the power converter in open-frame applications that omit the package or encapsulation. The open-frame power converter may also be mounted to an external circuit board using an interconnect extender located under the overhang region as shown in FIGS. 6A, 6B, 9A and 9B.

A number of embodiments of the invention have been described. Nevertheless, it will be understood that various modifications may be made without departing from the spirit and scope of the invention. Accordingly, other embodiments are within the scope of the following claims.

What is claimed is:

1. Apparatus comprising:
 a power converter including a circuit board having a top surface and a bottom surface, power conversion circuitry, and a package;
 the power conversion circuitry including a magnetic circuit having a magnetically permeable core, upper circuitry in a first region on the top surface of the circuit board, and lower circuitry in a second region on the bottom surface of the circuit board;
 the package including an upper portion defining an external top surface and a lower portion defining an external bottom surface;
 the upper portion enclosing the first region including the upper circuitry and connections between the upper circuitry and the circuit board;
 the lower portion enclosing the second region including the lower circuitry and connections between the lower circuitry and the circuit board;
 the second region being smaller than the first region;
 the first and second regions being arranged to define an external overhang region on the bottom surface of the circuit board, the overhang region extending along two or more sides of a periphery of the bottom surface of the circuit board; and
 interface contacts arranged within said overhang region on the bottom surface of the circuit board for making electrical connections to the power converter.

2. Apparatus comprising:
 a circuit board having a top surface and a bottom surface, circuitry, and a package;
 the circuitry including upper circuitry in a first region on the top surface of the circuit board, and lower circuitry in a second region on the bottom surface of the circuit board;
 the package including an upper portion defining an external top surface and a lower portion defining an external bottom surface;
 the upper portion enclosing the first region including the upper circuitry and connections between the upper circuitry and the circuit board;
 the lower portion enclosing the second region including the lower circuitry and connections between the lower circuitry and the circuit board;
 the second region being smaller than the first region;
 the first and second regions being arranged to define an external overhang region on the bottom surface of the circuit board, the overhang region extending along two or more sides of a periphery of the bottom surface of the circuit board; and
 interface contacts arranged within said overhang region on the bottom surface of the circuit board for making electrical connections to the circuitry.

3. The apparatus of claim 1 or 2 wherein said upper portion comprises an encapsulating material.

4. The apparatus of claim 1 or 2 wherein said lower portion comprises an encapsulating material.

5. The apparatus of claim 1 or 2 wherein the overhang extends along the entire periphery of the bottom surface of the circuit board.

6. The apparatus of claim 1 or 2, wherein:
the lower portion comprises a first thickness defined by the maximum distance between the external bottom surface and the bottom surface of the circuit board;
the upper portion comprises a second thickness defined by the maximum distance between the external top surface and the top surface of the circuit board; and
the first thickness is at least 10% greater than the second thickness.

7. The apparatus of claim 1 wherein the interface contacts are adapted to make connection with the power converter at an elevation between the external bottom surface and the bottom surface of the circuit board.

8. The apparatus of claim 1 wherein the magnetic core extends through the circuit board.

9. The apparatus of claim 1 wherein said upper and lower portions enclose all of said power conversion circuitry.

10. The apparatus of claim 1 wherein said interface contacts further comprise conductive elements.

11. The apparatus of claim 10 wherein said conductive elements comprise a ball-grid array.

12. The apparatus of claim 10 wherein said conductive elements comprise a land grid array.

13. The apparatus of claim 10 wherein said conductive elements comprise pins.

14. The apparatus of claim 1 wherein said power conversion circuitry comprises heat dissipating power conversion components arranged on the top surface of the circuit board and further comprising an average thermal resistance between the top surface of the circuit board and said external top surface less than 3 C/Watt per square inch of the top surface of the circuit board.

15. The apparatus of claim 14 wherein said heat dissipating power conversion components comprise a MOSFET.

16. The apparatus of claim 1 further comprising:
an external circuit board having a first surface and a second surface separated by a board thickness and having conductive regions on the second surface for making connections to the power converter;
the power converter being mounted to the external circuit board.

17. The apparatus of claim 16 wherein
the external circuit board comprises a board aperture,
the lower portion extends into the board aperture, and
the interface contacts are connected to the conductive regions.

18. The apparatus of claim 17 wherein
the lower portion comprises a first thickness defined by the maximum distance between the external bottom surface and the bottom surface of the circuit board;
the upper portion comprises a second thickness defined by the maximum distance between the external top surface and the top surface of the circuit board; and
the first thickness is greater than said second thickness and
a portion of the lower portion extends below the first surface.

19. The apparatus of claim 17 wherein the circuit board comprises a multilayer circuit board including alternating layers of electrically conductive and insulating materials and the interface contacts are connected to the multilayer circuit board.

20. The apparatus of claim 19 wherein the interface contacts comprise BGA contacts.

21. The apparatus of claim 20 wherein the top and bottom surfaces of the multilayer board are generally rectangular, the rectangular surfaces having a short side and a long side, the BGA contacts being arranged along the long side.

22. The apparatus of claim 21 wherein the dimensions of the rectangular surfaces are approximately 21 mm×32 mm and the BGA contacts are on a 1 mm pattern.

23. The apparatus of claim 19 further comprising a thermal resistance between the top surface of the multilayer board and the conductive regions on the second surface of the external circuit board that is less than 40 C/Watt per cm of package perimeter.

24. The apparatus of claim 16 further comprising
an interconnect extender having interface conductors for connecting the interface contacts to the conductive regions and having a first surface area for mating with the overhang region and a second surface area for mating with the external circuit board; and wherein
the power converter is mounted to the first surface area and the second surface area is mounted to the external circuit board.

25. The apparatus of claim 24 wherein
the interconnect extender further comprises an extender aperture, and
the lower portion extends into the extender aperture.

26. The apparatus of claim 25 wherein the interconnect extender further comprises an outer periphery generally matching the outer periphery of the overhang.

27. The apparatus of claim 25 wherein the extender aperture generally matches the outer periphery of the lower portion.

28. The apparatus of claim 27 further comprising a card-edge connector mounted to the external circuit board; and
wherein the second surface area comprises contact fingers for mating with the card-edge connector, and the extender is mounted to the external circuit board using the connector.

29. The apparatus of claim 25 wherein
the lower portion comprises a first thickness defined by the maximum distance between the external bottom surface and the bottom surface of the circuit board; and
the interconnect extender comprises a thickness between the first surface area and the second surface area; and
the thickness is greater than the first thickness.

30. The apparatus of claim 25 wherein
the external circuit board further comprises a board aperture,
the lower portion comprises a first thickness defined by the maximum distance between the external bottom surface and the bottom surface of the circuit board; and
the interconnect extender comprises a thickness between the first surface area and the second surface area and the thickness is less than the first thickness, and
the lower portion extends into the board aperture.

31. The apparatus of claim 25 further comprising a connector having conductive sockets connected to the conductive regions.

32. The apparatus of claim 31 wherein
a first end of the interface conductors connects to the interface contacts and a second end of the interface conductors comprises pins which connect with the sockets.

33. The apparatus of claim 25 wherein the first surface area is generally perpendicular to the second surface area and the aperture generally matches the outer periphery of the lower portion.

34. The apparatus of claim 24 wherein a first end of the interface conductors is adapted to connect to the interface contacts and a second end of the interface conductors is adapted to connect to the conductive regions.

35. The apparatus of claim 34 wherein the conductive elements comprise a ball-grid array.

36. The apparatus of claim 34 wherein the conductive elements comprise a land grid array.

37. The apparatus of claim 34 wherein the conductive elements comprise pins.

38. The apparatus of claim 34 wherein the conductive elements comprise J-leads.

39. The apparatus of claim 16 wherein the interface contacts further comprise conductive elements.

40. The apparatus of claim 39 wherein the conductive elements comprise a ball-grid array.

41. The apparatus of claim 39 wherein the conductive elements comprise a land grid array.

42. The apparatus of claim 39 wherein the conductive elements comprise pins.

43. The apparatus of claim 1 or 2 further comprising:
an external circuit board having a first surface and a second surface separated by a board thickness and having conductive regions on the second surface for making connections to the circuitry; and
an interconnect extender having interface conductors for connecting the interface contacts to the conductive regions and having a first surface area for mating with the overhang region and a second surface area for mating with the external circuit board;
the interconnect extender having a heat sink;
wherein the circuit board is mounted to the first surface area and the second surface area is mounted to the external circuit board.

44. The apparatus of claim 43 wherein the heat sink is attached to the first surface area.

45. The apparatus of claim 43 wherein the interconnect extender comprises a thermally conductive layer and the heat sink comprises an extension of the thermally conductive layer.

46. The apparatus of claim 1 or 2 further comprising:
an external circuit board having a first surface and a second surface separated by a board thickness and having conductive regions on the second surface for making connections to the circuit board of the apparatus; and
a heat sink located on the external circuit board and thermally coupled to the external circuit board;
wherein the circuit board is mounted to the external circuit board and the circuitry is thermally coupled to the heat sink through the circuit board and the external circuit board.

47. The apparatus of claim 46 wherein the heat sink is mounted to the second surface of the external circuit board.

48. The apparatus of claim 46 wherein the package comprises a perimeter and further comprising a thermal resistance between the heat sink and the top surface of the circuit board of less than 80 C/Watt per cm of the package perimeter.

49. A method comprising:
packaging a power converter including,
providing a circuit board having a top surface and a bottom surface;
arranging power conversion circuitry on the top and bottom surfaces of the circuit board with upper circuitry in a first region on the top surface of the circuit board and lower circuitry in a second region on the bottom surface of the circuit board;
enclosing the first region, the upper circuitry, and connections between the upper circuitry and the circuit board in an upper portion enclosure;
enclosing the second region, the lower circuitry, and connections between the lower circuitry and the circuit board in a lower portion enclosure, the second region being smaller than the first region;
arranging the first and second regions to define an overhang region on the bottom surface of the circuit board, the overhang region extending along two or more sides of a periphery of the bottom surface of the circuit board; and
providing interface contacts on the bottom surface of the circuit board in the overhang region for making electrical connections to the power converter.

50. The method of claim 49 wherein enclosing the first region comprises encapsulating.

51. The method of claim 49 wherein enclosing the second region comprises encapsulating.

52. The method of claim 49 wherein enclosing the first region comprises enclosing all of the power conversion circuitry on the top surface of the circuit board.

53. The method of claim 49 wherein the enclosing of the first and second regions comprises enclosing all of the power conversion circuitry.

54. The method of claim 53 wherein the enclosing of the first and second regions further comprises encapsulating.

55. The method of claim 54 wherein the providing interface contacts comprises attaching interface contacts to the circuit board before encapsulating the second region.

56. The method of claim 55 wherein the attaching further comprises attaching a ball grid array to the circuit board.

57. The method of claim 56 wherein the encapsulating further comprises using a mold having a step over cavity for accommodating the interface contacts.

58. The method of claim 49 further comprising:
providing an external circuit board having a top surface and a bottom surface separated by a board thickness;
providing conductive regions on the top surface of the external circuit board for making connections to the power converter;
mounting the power converter to the external circuit board.

59. The method of claim 58 further comprising providing an aperture in the external circuit board for accommodating the lower portion enclosure and wherein the mounting comprises placing the lower portion enclosure in the aperture and connecting the interface contacts to the conductive regions.

60. The method of claim 59 wherein:
the lower portion enclosure comprises a first thickness defined by the maximum distance between an external bottom surface and the bottom surface of the circuit board;
the upper portion comprises a second thickness defined by the maximum distance between an external top surface and the top surface of the circuit board; and the method further comprises:
making the first thickness greater than the second thickness and mounting the power converter with a portion of the lower portion enclosure extending below the bottom surface of the external circuit board.

61. The method of claim 59 further comprising providing a thermal resistance between the top surface of the circuit board and the conductive regions on the top surface of the external circuit board less than 40 C/Watt per cm of package perimeter.

62. The method of claim 58 further comprising providing an interconnect extender for mating with the overhang region and the top surface of the external circuit board, the interconnect extender having interface conductors for connecting the interface contacts to the conductive regions.

63. The method of claim 62 further comprising providing the interconnect extender with an extender aperture for accommodating the lower portion enclosure.

64. The method of claim 63 further comprising providing the interconnect extender with an outer periphery generally matching the outer periphery of the overhang.

65. The method of claim 63 further comprising matching the extender aperture with the outer periphery of the lower portion enclosure.

66. The method of claim 62 wherein:
the lower portion enclosure comprises a first thickness defined by the maximum distance between an external bottom surface and the bottom surface of the circuit board; and further comprising providing the interconnect extender with a thickness greater than the first thickness.

67. The method of claim 62 wherein:
the lower portion enclosure comprises a first thickness defined by the maximum distance between an external bottom surface and the bottom surface of the circuit board; and further comprising:
providing a board aperture in the external circuit board,
providing the interconnect extender with a thickness less than the first thickness, and
placing the lower portion enclosure into the extender aperture and in the board aperture.

68. The method of claim 62 further comprising mounting the power converter to the interconnect extender and mounting the interconnect extender to the external circuit board wherein the overhang surface is generally perpendicular to the top or bottom surface of the external circuit board.

69. The method of claim 68 further comprising mechanically stabilizing the interconnect extender to the board.

70. The method of claim 62 further comprising mounting the power converter to the interconnect extender; and
providing a card edge connector on the external circuit board for receiving the interconnect extender;
wherein the overhang surface is generally perpendicular to the top or bottom surface of the external circuit board.

71. The method of claim 58 further comprising connecting the interface contacts to the conductive regions using a ball grid array.

72. Apparatus comprising:
a power converter including a circuit board having a top surface and a bottom surface, and power conversion circuitry;
the power conversion circuitry including a magnetic circuit having a magnetically permeable core, upper circuitry in a first region on the top surface of the circuit board, and lower circuitry in a second region on the bottom surface of the circuit board;
the second region being smaller than the first region;
the first and second regions being arranged to define an overhang region on the bottom surface of the circuit board, the overhang region extending along two or more sides of a periphery of the bottom surface;
interface contacts arranged within said overhang region on the bottom surface for making electrical connections to the power converter; and
an external circuit board having an aperture larger than the second region of the power converter and conductive regions for making connections to the power converter;
the power converter being connected to the external circuit board and the second region of the power converter extending into said aperture.

73. The apparatus of claim 72 wherein the interface contacts comprise a BGA.

74. The apparatus of claim 72 wherein the interface contacts comprise a LGA.

75. The apparatus of claim 72 wherein the interface contacts comprise an interconnect extender.

* * * * *

UNITED STATES PATENT AND TRADEMARK OFFICE
CERTIFICATE OF CORRECTION

PATENT NO. : 7,361,844 B2  Page 1 of 1
APPLICATION NO. : 10/303613
DATED : April 22, 2008
INVENTOR(S) : Patrizio Vinciarelli et al.

It is certified that error appears in the above-identified patent and that said Letters Patent is hereby corrected as shown below:

On the title page, item [56]:
Page 2, column 2 (Other Publications), line 20, delete "www.cotorelya.com" and insert --www.cotorelay.com-- therefor.

Page 2, column 2 (Other Publications), line 21, delete "seris.htm" and insert --series.htm-- therefor.

Column 9, line 44, delete "t h e" and insert --the-- therefor.

Figure 16E:
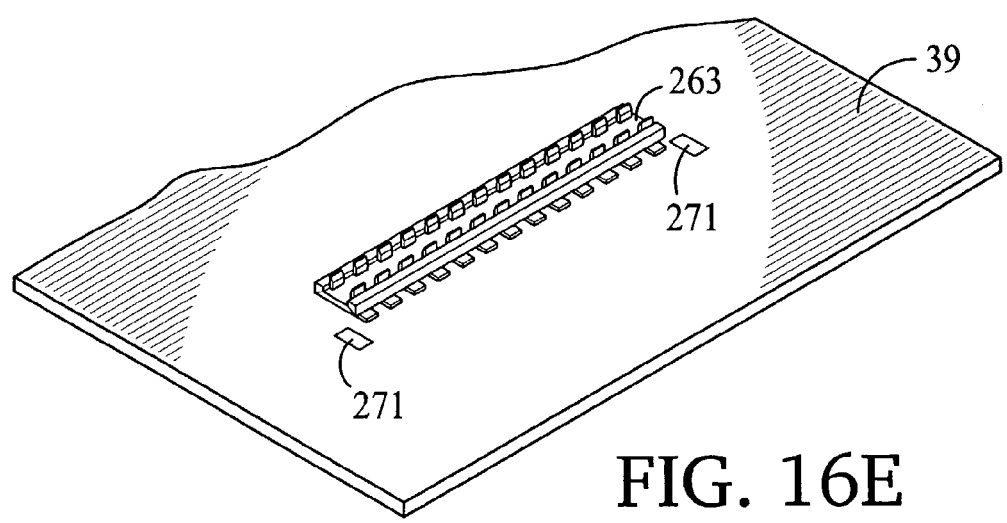
FIG. 16E shows contacts for use with a vertical interconnect extender.

Column 17, line 11, delete "FIG. 16F)" and insert --FIG. 16E)-- therefor.

Column 18, line 8, delete "FIGS." and insert --FIG.-- therefor.

Column 24, line 13 (Claim 49), after "an" please insert --external--.

Column 26, line 23 (Claim 72), before "overhang" please insert --external--.

Signed and Sealed this

Eighteenth Day of May, 2010

David J. Kappos
*Director of the United States Patent and Trademark Office*